(12) United States Patent
Kodama

(10) Patent No.: US 9,412,461 B1
(45) Date of Patent: Aug. 9, 2016

(54) NONVOLATILE SEMICONDUCTOR MEMORY DEVICE

(71) Applicant: KABUSHIKI KAISHA TOSHIBA, Minato-ku (JP)

(72) Inventor: Takuyo Kodama, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/846,106

(22) Filed: Sep. 4, 2015

Related U.S. Application Data

(60) Provisional application No. 62/130,765, filed on Mar. 10, 2015.

(51) Int. Cl.
| | | |
|---|---|---|
| G11C 11/4074 | (2006.01) | |
| G11C 11/4094 | (2006.01) | |
| G11C 7/08 | (2006.01) | |
| G11C 7/12 | (2006.01) | |
| G11C 7/06 | (2006.01) | |
| G11C 5/14 | (2006.01) | |
| G11C 16/26 | (2006.01) | |
| G11C 16/10 | (2006.01) | |
| G11C 16/30 | (2006.01) | |
| G11C 16/24 | (2006.01) | |

(52) U.S. Cl.
CPC .............. *G11C 16/26* (2013.01); *G11C 16/10* (2013.01); *G11C 5/14* (2013.01); *G11C 5/145* (2013.01); *G11C 5/147* (2013.01); *G11C 5/148* (2013.01); *G11C 7/06* (2013.01); *G11C 7/12* (2013.01); *G11C 11/4074* (2013.01); *G11C 16/24* (2013.01); *G11C 16/30* (2013.01)

(58) Field of Classification Search
CPC ...... G11C 5/147; G11C 7/12; G11C 11/4074; G11C 7/06; G11C 16/24; G11C 5/14; G11C 5/145; G11C 5/148; G11C 16/30

USPC ............. 365/185.17, 185.18, 185.21, 185.23, 365/189.06, 189.05, 189.09, 226, 227, 228, 365/229
See application file for complete search history.

(56) References Cited

U.S. PATENT DOCUMENTS

| | | | | |
|---|---|---|---|---|
| 5,894,445 | A * | 4/1999 | Kobayashi | G11C 29/02 365/201 |
| 2006/0112321 | A1* | 5/2006 | Leung | G06F 11/1056 714/774 |
| 2006/0181917 | A1* | 8/2006 | Kang | G11C 7/065 365/149 |
| 2008/0056032 | A1* | 3/2008 | Tomita | G11C 29/02 365/200 |
| 2008/0304339 | A1* | 12/2008 | Dietrich | G11C 13/00 365/189.16 |
| 2009/0219756 | A1* | 9/2009 | Schroegmeier | G11C 11/5614 365/163 |
| 2009/0267128 | A1 | 10/2009 | Maejima | |
| 2009/0268522 | A1 | 10/2009 | Maejima | |
| 2010/0207195 | A1 | 8/2010 | Fukuzumi et al. | |
| 2010/0246302 | A1* | 9/2010 | Seko | G11C 7/02 365/205 |
| 2011/0284946 | A1 | 11/2011 | Kiyotoshi | |
| 2013/0193507 | A1* | 8/2013 | Yoshida | G11C 11/4091 257/329 |
| 2014/0078830 | A1* | 3/2014 | McCollum | G11C 16/26 365/185.21 |

* cited by examiner

*Primary Examiner* — Ly D Pham
(74) *Attorney, Agent, or Firm* — Oblon, McClelland, Maier & Neustadt, L.L.P

(57) ABSTRACT

According to one embodiment, a nonvolatile semiconductor memory device includes: a first memory cell transistor; a first bit line; a first sense amplifier unit; a voltage generator; and a switch circuit. In a case where a power-supply voltage is equal to or lower than a first voltage and is higher than a second voltage when an access operation to the first memory cell transistor is started, the first sense amplifier unit is electrically disconnected from the first bit line and is electrically connected to the voltage generator via the switch circuit.

18 Claims, 16 Drawing Sheets

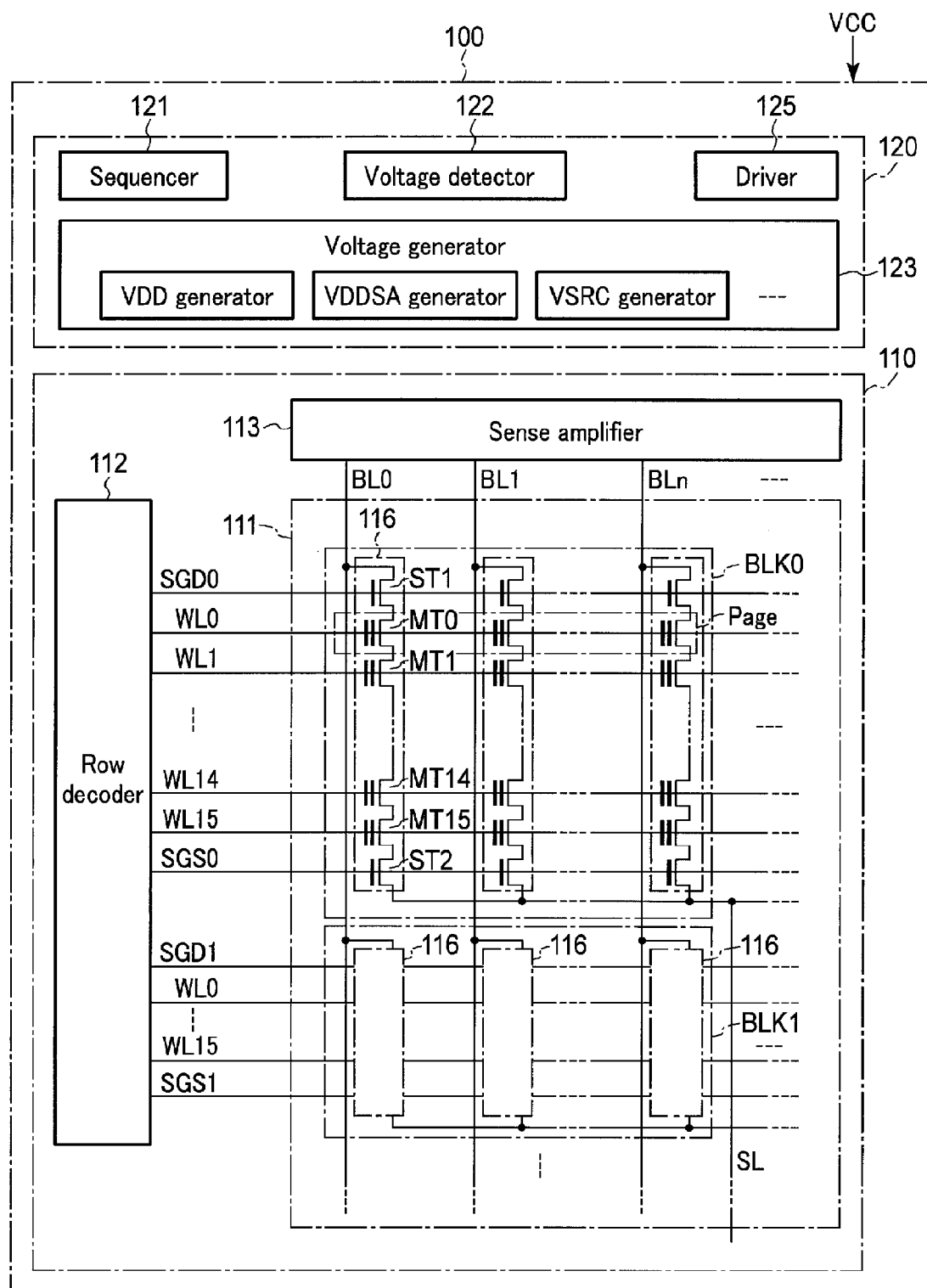
F I G. 1

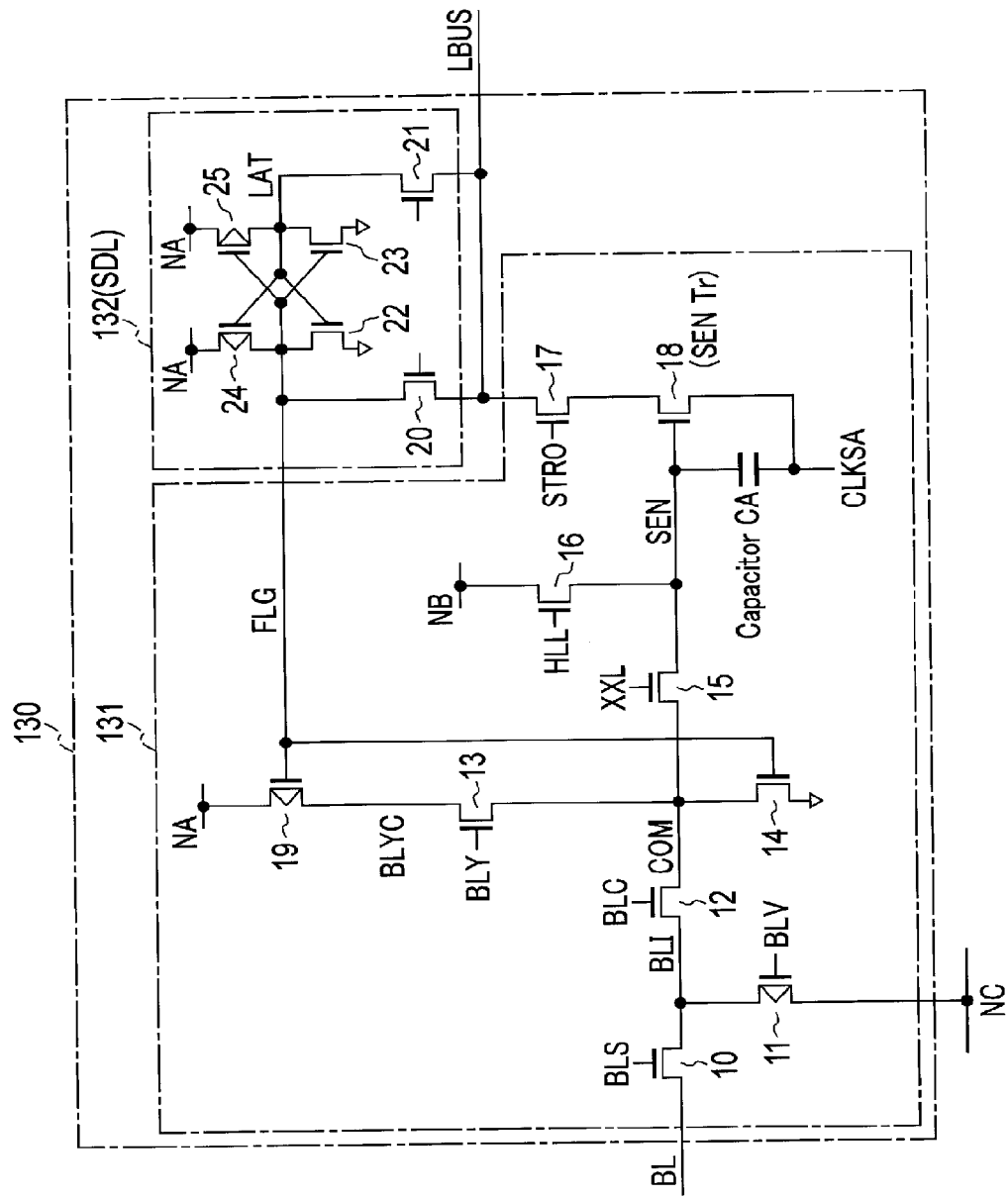
F I G. 3

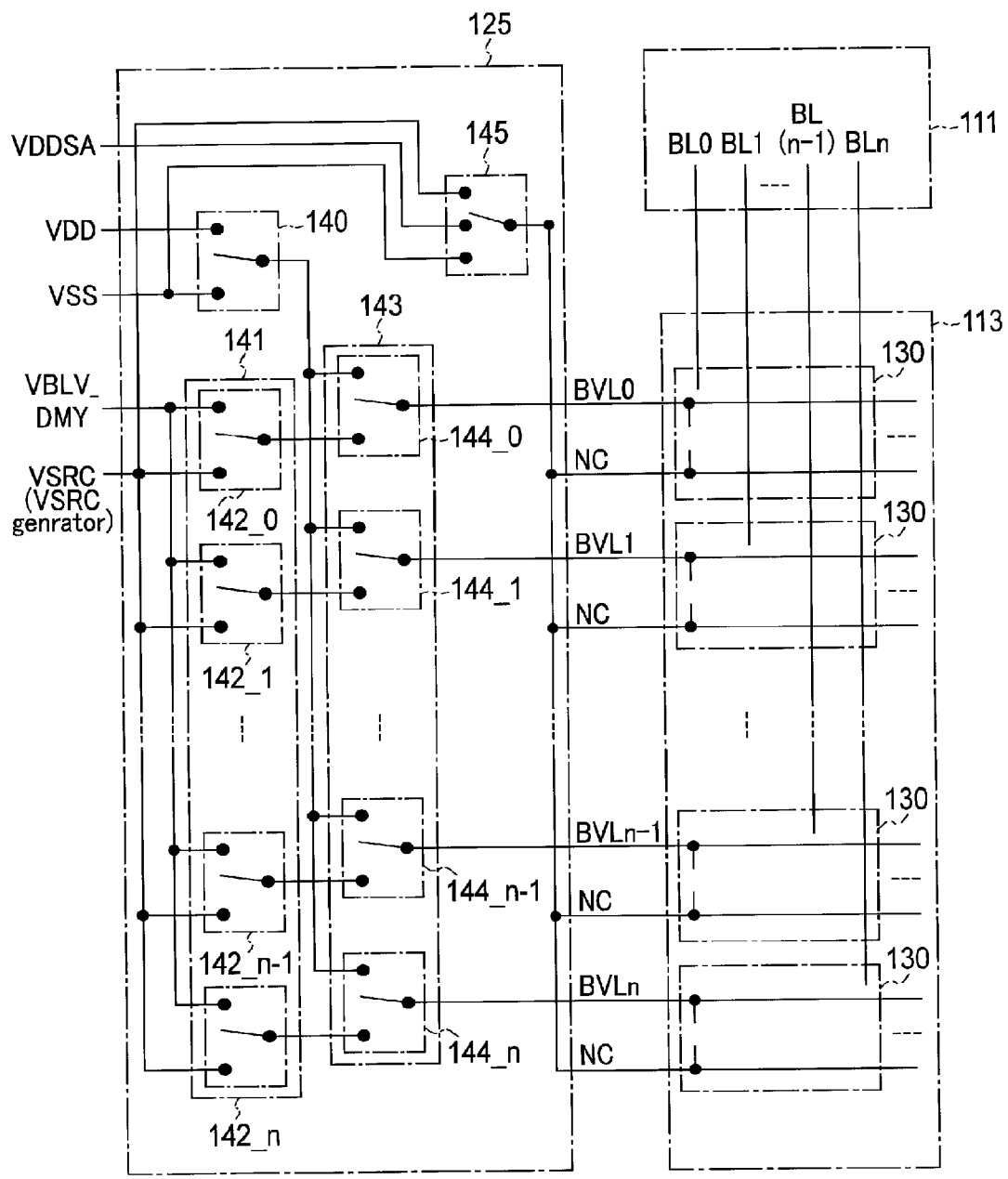
F I G. 4

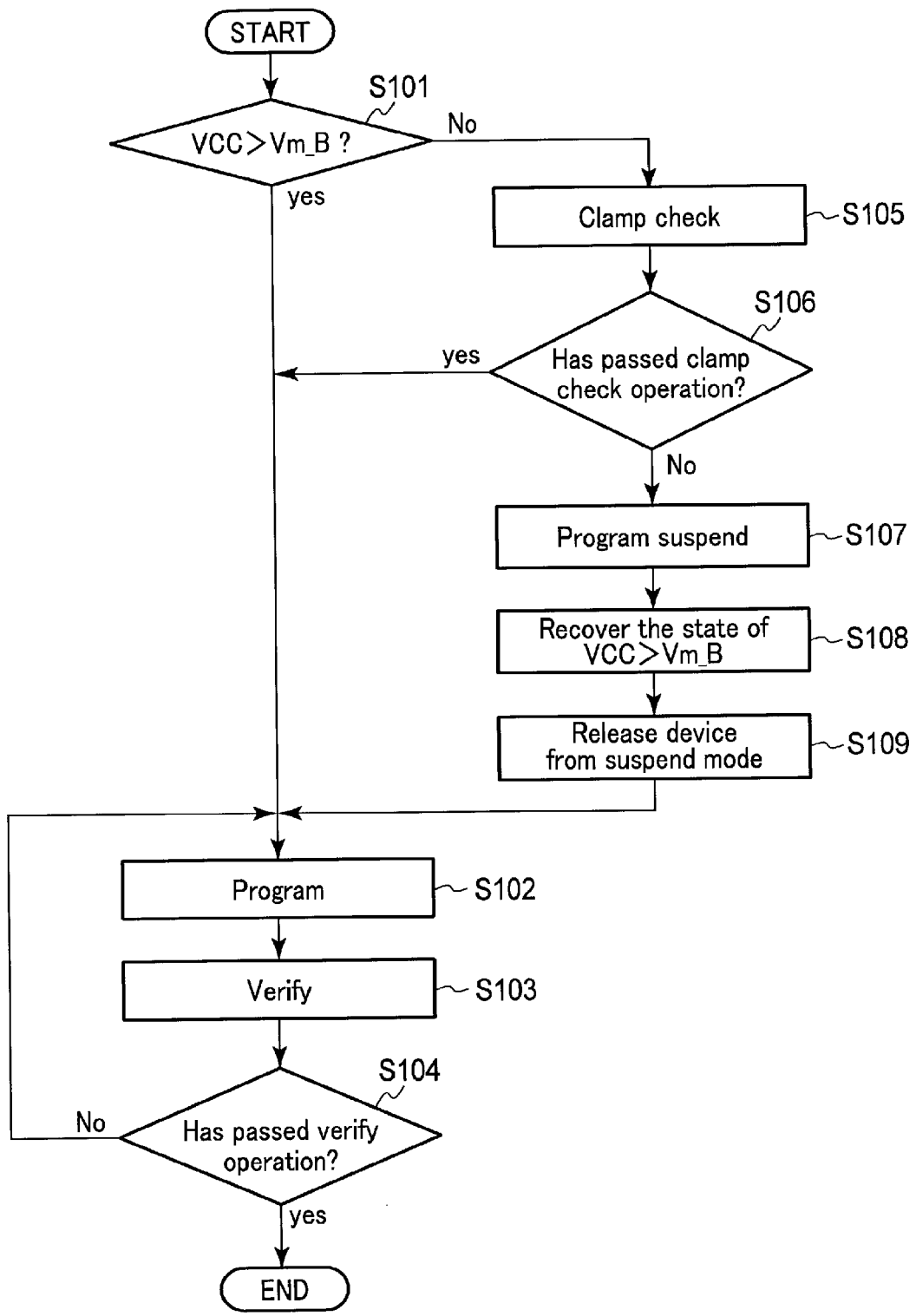
F I G. 5

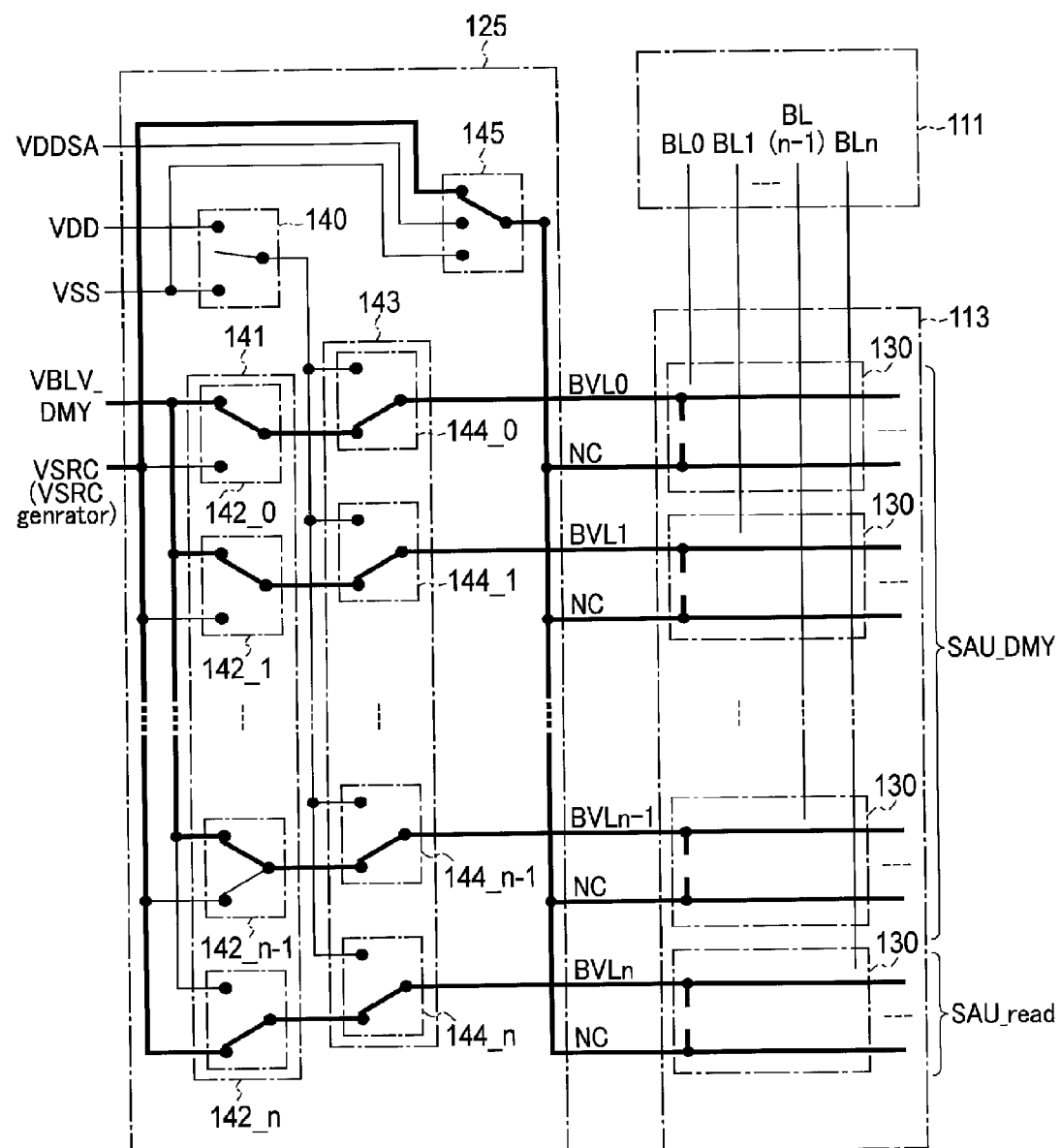
F I G. 7

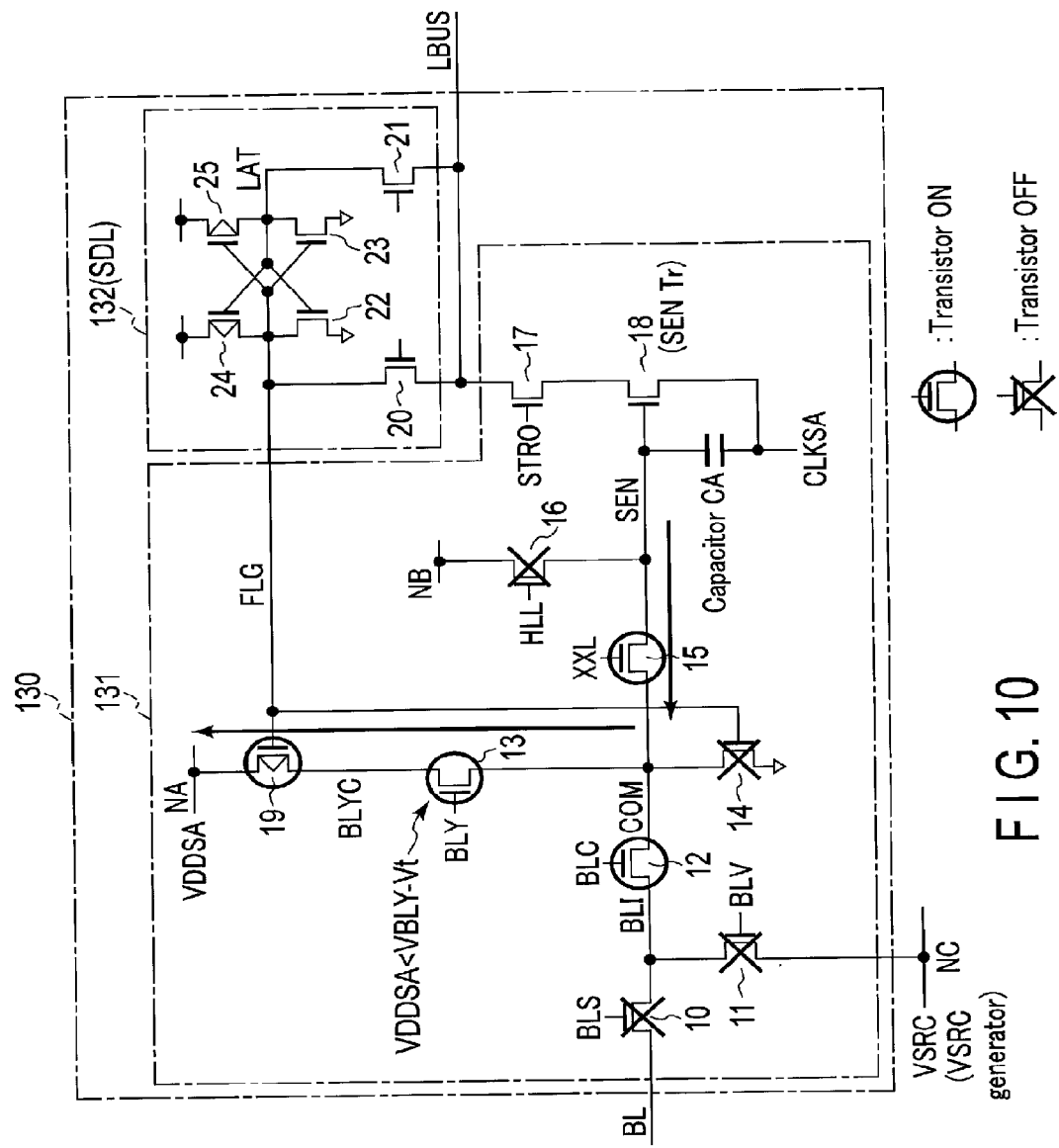
F I G. 10

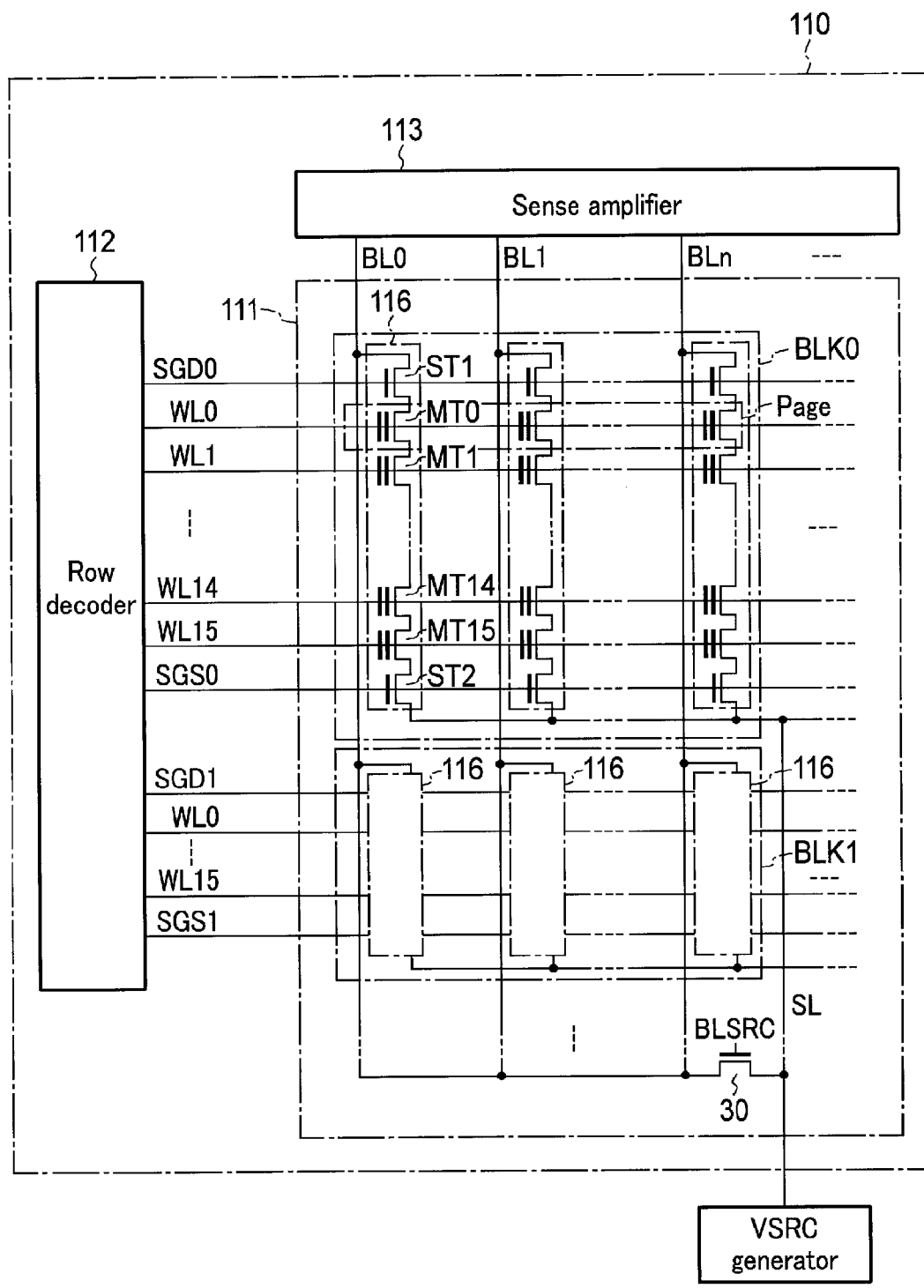
F I G. 12

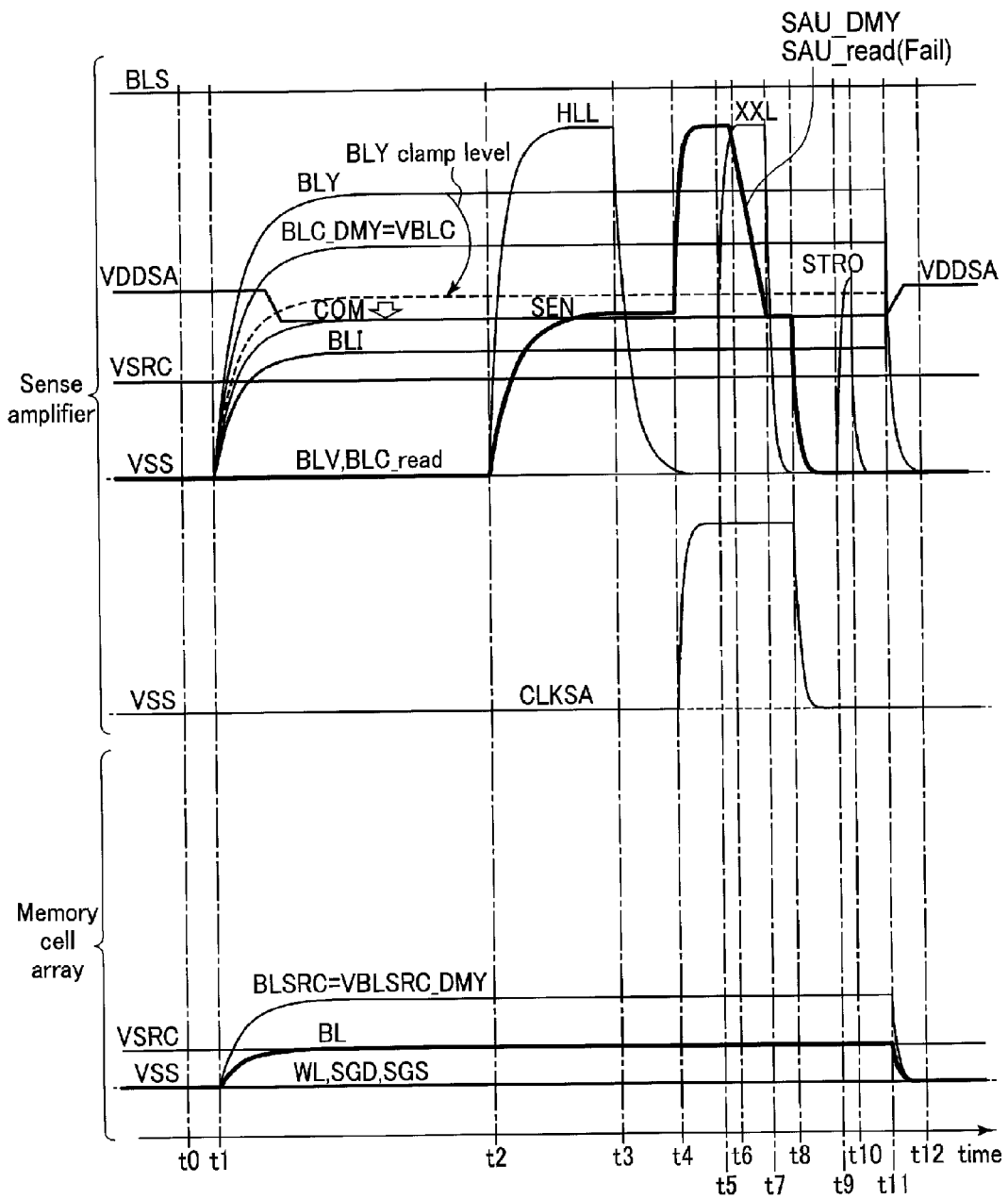
F I G. 15

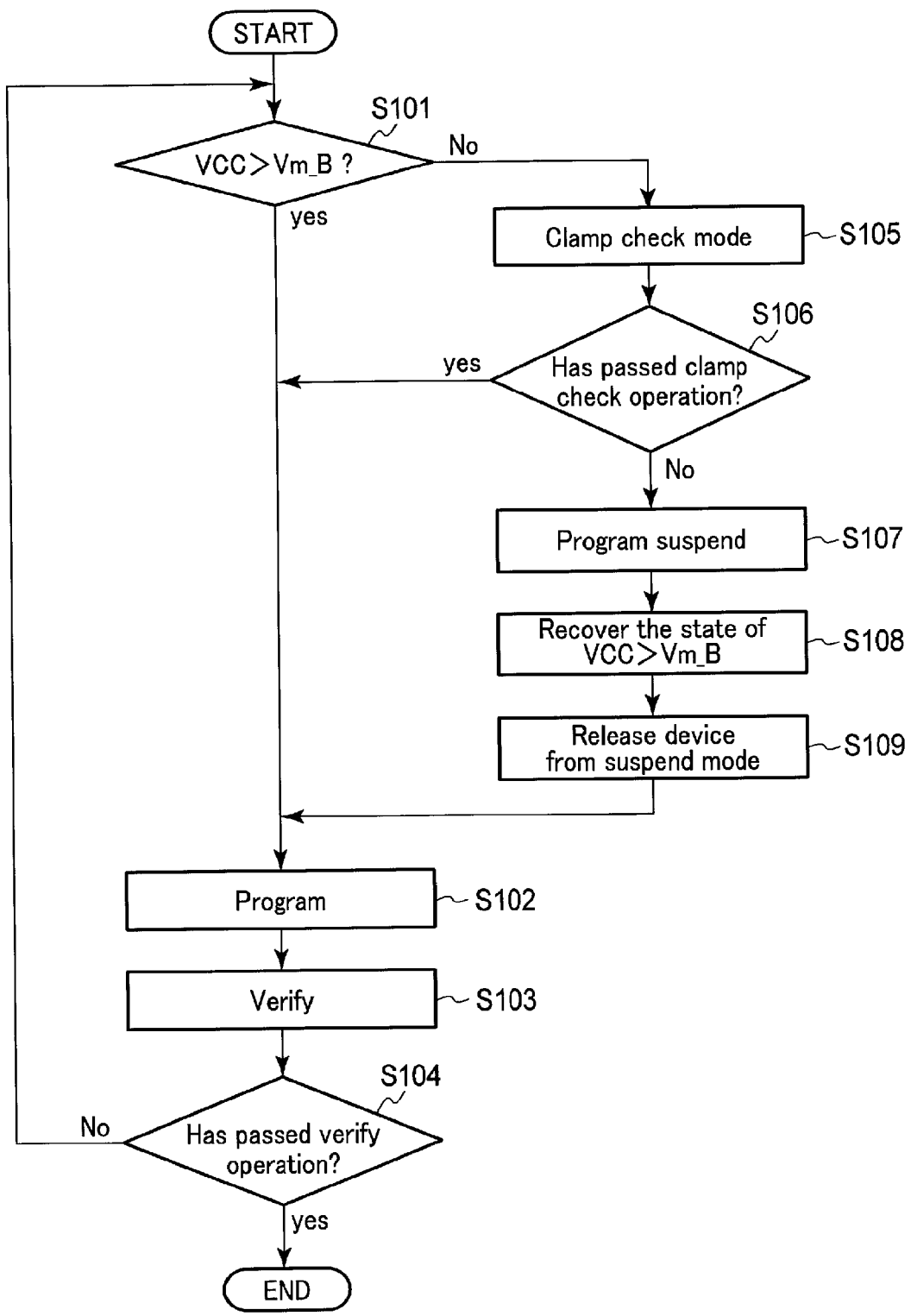
F I G. 16

NONVOLATILE SEMICONDUCTOR MEMORY DEVICE

CROSS-REFERENCE TO RELATED APPLICATIONS

This application claims the benefit of U.S. Provisional Application No. 62/130,765, filed Mar. 10, 2015, the entire contents of which are incorporated herein by reference.

FIELD

Embodiments described herein relate generally to a nonvolatile semiconductor memory device.

BACKGROUND

A NAND flash memory is known as a nonvolatile semiconductor memory device.

BRIEF DESCRIPTION OF THE DRAWINGS

FIG. 1 is a block diagram showing the overall configuration of a nonvolatile semiconductor memory device according to a first embodiment;

FIG. 3 is a circuit diagram of a sense amplifier provided in the nonvolatile semiconductor memory device according to the first embodiment;

FIG. 4 is a block diagram showing a driver provided in the nonvolatile semiconductor memory device according to the first embodiment;

FIG. 5 is a flowchart explaining a write operation performed in the nonvolatile semiconductor memory device according to the first embodiment;

FIG. 7 is a block diagram showing how the driver operates in a clamp check operation in the nonvolatile semiconductor memory device according to the first embodiment;

FIG. 10 is a circuit diagram showing how the node SEN is electrically discharged during the clamp check operation in the sense amplifier provided in the nonvolatile semiconductor memory device according to the first embodiment;

FIG. 12 is a block diagram showing a memory cell array provided in a nonvolatile semiconductor memory device according to a second embodiment;

FIG. 15 a timing chart showing voltages of various lines when the clamp check operation fails in the nonvolatile semiconductor memory device according to the second embodiment; and FIG. 16 is a flowchart explaining the write operation performed in the nonvolatile semiconductor memory device according to the modification of the first embodiment.

DETAILED DESCRIPTION

Figure 2:
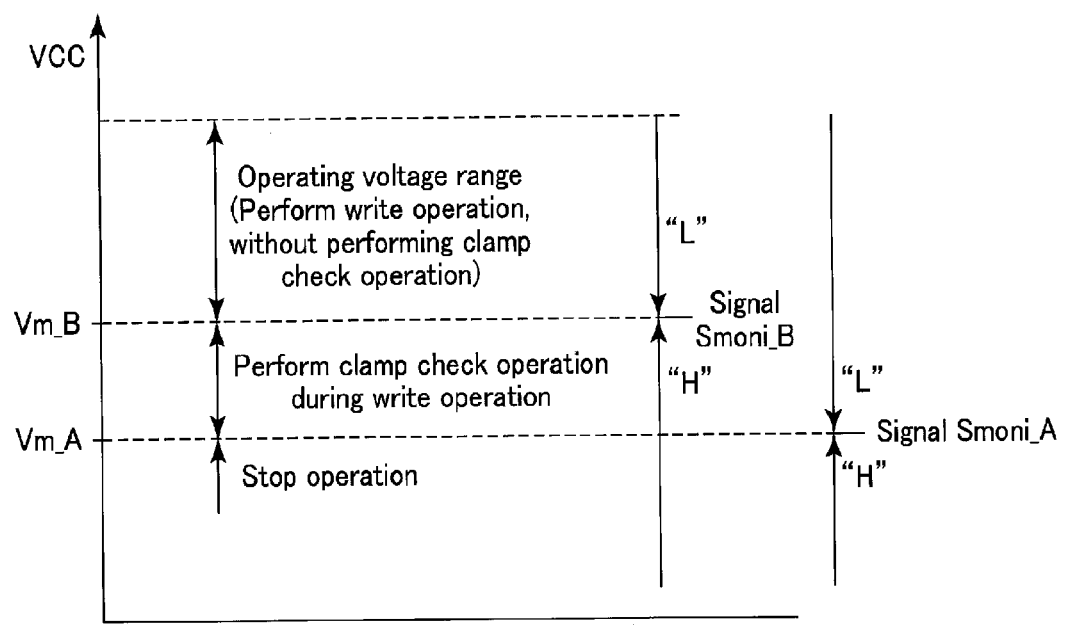
FIG. 2 is a graph showing voltage levels detected in a voltage detector provided in the nonvolatile semiconductor memory device according to the first embodiment.

Nonvolatile semiconductor memory devices according to embodiments will be described with reference to the accompanying drawings. In the following description, any components identical in function and configuration are designated by the same reference number or symbol and will be repeatedly described only if necessary. Each embodiment described below is either a device or a method that embodies a technical concept of the embodiment. The material, shape, structure, arrangement and the like of each component are not limited to those specified below.

In general, according to one embodiment, a nonvolatile semiconductor memory device includes a first memory cell transistor, a first bit line, a source line, a first sense amplifier unit, a voltage generator, and a switch circuit. The first bit line is coupled to the first memory cell transistor. The source line is coupled to the first memory cell transistor. The first sense amplifier unit is coupled to the first bit line. The voltage generator is capable of applying voltage to the source line. The switch circuit is electrically connectable the first sense amplifier unit and the voltage generator, without using the first bit line. In a case where a power-supply voltage is equal to or lower than first voltage and is higher than second voltage when an access operation to the first memory cell transistor is started, the first sense amplifier unit is electrically disconnected from the first bit line and is electrically connected to the voltage generator via the switch circuit.

The embodiments described below are nonvolatile semiconductor memory devices, each being, for example, a planer NAND flash memory in which memory cell transistors are arranged on the semiconductor substrate, in the form of a two-dimensional pattern.

1. First Embodiment

A nonvolatile semiconductor memory device according to a first embodiment will be described.

1.1 Overall Configuration of the Nonvolatile Semiconductor Memory Device

FIG. 1 is a block diagram showing the overall configuration of the nonvolatile semiconductor memory device according to the first embodiment. The NAND flash memory 100 according to this embodiment is controlled by an external controller, and is driven by the power-supply voltage VCC applied from the external controller. The NAND flash memory 100 includes a core unit 110 and a peripheral circuit unit 120. The core unit 110 includes a memory cell array 111, a row decoder 112, and a sense amplifier 113.

The memory cell array 111 includes a plurality of blocks BLK (BLK0, BLK1, . . . ), each composed of a plurality of nonvolatile semiconductor memory-cell transistors. The blocks BLK are arranged in the form of a matrix. For simplicity of explanation, only one of the blocks BLK arranged in any column will be described below. Each block BLK includes a plurality of NAND strings 116, each having memory cell transistors MT connected in series. The memory cell transistors MT are arranged on a semiconductor substrate, in a two-dimensional pattern. The number of NAND strings 116 included in one block is optional.

Each of the NAND strings 116 includes, for example, 16 memory cell transistors MT (MT0 to MT15), a selection transistor ST1, and a selection transistor ST2. Each memory cell transistor MT includes a control gate and a charge accumulation layer, and holds data in a nonvolatile manner. The memory cell transistors MT may be of the MONOS type having an insulation film used as a charge accumulation layer, or FG type having an electrically conductive film as a charge accumulation layer. Further, the number of memory cell transistors MT is not limited to 16. Instead, 8, 32, 64 or 128 memory cell transistors MT may be used. That is, the number of memory cell transistors MT is not limited.

The memory cell transistors MT0 to MT15 are connected in series. The memory cell transistor MT0 at one end of the serial connection has its drain connected to the source of the selection transistor ST1. The memory cell transistor MT15 at the other end of the serial connection has its source connected to the drain of the selection transistor. ST2.

In the same block BLK, the selection transistors ST1 have their gates connected to the select gate line SGD. Similarly, in the same block BLK, the selection transistors ST2 have their gates connected to the same select gate line SGS.

Further, in each block BLK, the memory cell transistors MT0 to MT15 of each NAND string 116 have their control gates connected to word lines WL0 to WL15, respectively.

Of the NAND strings 116 arranged in the form of a matrix, in the memory cell array 111, those arranged in the same column have selection transistors ST1 with their drains connected, in common, to one of the bit lines BL0 to BLn (n is an integer greater than 0, representing the number of bit lines of the blocks BLK in the same column). That is, each bit line BL connects the NAND strings 116 arranged in the same column in any blocks BLK. The selection transistors ST2 of the NAND strings 116 have their sources connected, in common, to a source line SL. That is, the source line SL connects the NAND strings 116 of the blocks BLK.

The row decoder 112 decodes the address of a block BLK or a page, thereby selecting word lines WL in order to, for example, write or read data. The row decoder 112 then applies appropriate voltages to the word lines WL, select gate line SGD and select gate line SGS.

The sense amplifier 113 includes a plurality of sense amplifier units, which will be described later. The sense amplifier units are provided for the bit lines BL, respectively. To read data, each sense amplifier unit senses the data read from the memory cell transistors MT to the bit line BL. To write data, the sense amplifier unit transfers the write data through the bit line WL to the memory cell transistor MT.

The peripheral circuit unit 120 includes a sequencer 121, a voltage detector 122, a voltage generator 123, and a driver 125.

The sequencer 121 controls the other components of the NAND flash memory 100.

The voltage detector 122 detects a drop of the power-supply voltage VCC and recovery of the power-supply voltage VCC, in accordance with a voltage-detection level preset, and transmits a signal representing the voltage drop or voltage recovery to the sequencer 121. FIG. 2 is a graph showing the detected levels of the power-supply voltage VCC. The voltage detector 122 transmits signals Smoni_A and Smoni_B to the sequencer 121, in accordance with the level of the power-supply voltage VCC. The signal Smoni_A is at, for example, "H" level, while the power-supply voltage VCC remains equal to or lower than voltage Vm_A. The signals Smoni_B is at, for example, "H" level, while the power-supply voltage VCC remains equal to or lower than voltage Vm_B. The voltage Vm_A is lower than the minimum voltage necessary in the peripheral circuit unit 120. The sequencer 121 causes, for example, the NAND flash memory 100 to stop operating, when the signal Smoni_A changes to "H" level. Vm_B is a voltage lower than the lower limit of the operating voltage range of the NAND flash memory 100. Namely, Vm_B>Vm_A.

The voltage generator 123 raises or drops the power-supply voltage VCC applied by an external controller, thereby generating voltages necessary for writing, reading or erasing data, and applies these voltages to the driver 125. More specifically, the voltage generator 123 includes a VDD generator generating voltage VDD, a VDDSA generator generating voltage VDDSA to apply to the sense amplifier 113, and a VSRC generator generating voltage VSRC to apply to the source line SL. The voltage generator 123 includes a charge pump (not shown) raising the voltage.

The driver 125 transfers the voltages applied from the voltage generator 123, to the row decoder 112, sense amplifier 113 and source line SL, thereby to write, read or erase data.

The memory cell transistors may be two-dimensionally disposed on a semiconductor substrate and may be three-dimensionally stacked above the semiconductor substrate.

In addition, the configuration of the memory cell array 18 in the three-dimensional stack type NAND flash memory is disclosed in, for example, U.S. patent application Ser. No. 12/407,403, filed on Mar. 19, 2009, entitled "THREE DIMENSIONAL STACKED NONVOLATILE SEMICONDUCTOR MEMORY". In addition, it is disclosed in U.S. patent application Ser. No. 12/406,524, filed on Mar. 18, 2009, entitled "THREE DIMENSIONAL STACKED NON-VOLATILE SEMICONDUCTOR MEMORY", U.S. patent application Ser. No. 12/679,991, filed on Mar. 25, 2010, entitled "NON-VOLATILE SEMICONDUCTOR STORAGE DEVICE AND METHOD OF MANUFACTURING THE SAME", and U.S. patent application Ser. No. 12/532, 030, filed on Mar. 23, 2009, entitled "SEMICONDUCTOR MEMORY AND METHOD FOR MANUFACTURING SAME". These patent applications are incorporated herein by reference in their entirety.

1.2 Configuration of the Sense Amplifier 113

FIG. 3 is the circuit diagram of the sense amplifier unit provided in the sense amplifier 113. In this embodiment, the sense amplifier 113 is, for example, of a current sensing type that senses the current flowing in any bit line BL. The sense amplifier 113 used in this embodiment includes sense amplifier units 130 shown in FIG. 3, which are provided for bit lines BL, respectively.

Each sense amplifier unit 130 includes a sense circuit 131 and a latch circuit 132. In FIG. 3, only one latch circuit 132 is shown. A plurality of latch circuits may be provided, nonetheless. For example, a plurality of latch circuits is provided a plurality of latch circuits if each memory cell transistor MT holds data of two or more bits.

The sense circuit 131 includes n-channel MOS transistors 10 to 18, a p-channel MOS transistor 19, and a capacitor element CA.

A signal BLS is input to a gate of the transistor 10, one of a source and a drain of the transistor 10 is connected to the bit line BL, and the other is connected to a node BLI. The signal BLS supplied to the transistor 10 is set to "H" level, turning on the transistor 10 in order to, for example, read data or write data. The sense amplifier unit 130 is thereby electrically connected to the associated bit line BL. A signal BLV is input to a gate of the transistor 11, one of a source and a drain of the transistor 11 is connected to a node BLI, and the other is connected to an internal power-supply node NC. To the node NC, for example, any one of the voltage VDDSA, voltage VSRC and ground-voltage VSS (e.g., 0V) is applied. The signal BLV on the transistor 11 is set to "L" level, thereby setting the transistor 11 to the off state, for example, in a read operation or a write operation. The sense amplifier unit 130 is thereby electrically disconnected from the node NC. A signal BLC is input to a gate of the transistor 12, one of a source and a drain of the transistor 12 is connected to the node BLI, and the other is connected to a node COM. The transistor 12 is used to clamp the associated bit line BL at the voltage according to the signal BLC. A signal BLY is input to a gate of the transistor 13, one of a source and a drain of the transistor 13 is connected to a node BLYC, and the other is connected to the node COM. The transistor 13 is used to clamp the associated node COM at the voltage according to the signal BLY (e.g., voltage VDDSA).

A node FLG is connected to a gate of the transistor 14, one of a source and a drain of the transistor 14 is connected to the node COM, and the other is applied with the ground voltage VSS. A node FLG is connected to a gate of the transistor 19, one of a source and a drain of the transistor 19 is connected to an internal power-supply node NA, and the other is connected to the node BLYC. The node NA, for example, is connected to the VDDSA generator of the voltage generator 123, and is applied with the voltage VDDSA. The transistors 14 and 19 function as switches that are turned on and off, respectively, in accordance with the data held in the latch circuit 132. For example, in a case where the node FLG is at "L" level, the transistor 14 is turned off and the transistor 19 is turned on. In a case where the node FLG is at "H" level, the transistor 14 is turned on and the transistor 19 is turned off.

A signal XXL is input to a gate of the transistor 15, one of a source and a drain of the transistor 15 is connected to the node COM, and the other is connected to a node SEN. A signal HLL is input to a gate of the transistor 16, one of a source and a drain of the transistor 16 is connected to the node SEN, and the other is connected to an internal power-supply node NB. The node NB is connected to the voltage generator 123, and is applied with a positive voltage different from, for example, voltage VDDSA. A signal STRO is input to a gate of the transistor 17, one of a source and a drain of the transistor 17 is connected to a node LBUS, and the other is connected to one of a source and a drain of the transistor 18. The node SEN is connected to a gate of the transistor 18, and a clock signal CLKSA is input to the other of a source and a drain of the transistor 18. The transistor 18 functions as a sense transistor to sense the voltage at the node SEN.

One electrode of the capacitor element CA is connected to the node SEN. A clock signal CLKS is input to the other electrode of the capacitor element CA.

The latch circuit 132 will be described. The latch circuit 132 includes n-channel MOS transistors 20 to 23 and p-channel MOS transistors 24 and 25.

The transistors 20 and 21 function as transfer gates. The transistor 20 controls the connection of the nodes LBUS and FLG. The transistor 21 controls the connection of the nodes LBUS and LAT.

The node LAT is connected to a gate of the transistor 24, one of a source and a drain of the transistor 24 is connected to the node FLG, and the other is connected to, for example, the node NA. The node LAT is connected to the transistor 22, one of a source and a drain of the transistor 22 is connected to the node FLG, and the other is applied with the ground voltage VSS. The node FLG is connected to the transistor 25, one of a source and a drain of the transistor 25 is connected to, for example, the node NA, and the other is connected to the node LAT. The node FLG is connected to the transistor 23, one of a source and a drain of the transistor 23 is connected to the node LAT, and the other is applied with the ground voltage VSS.

In the latch circuit 132, the transistors 22 and 24 constitute a first inverter, and the transistors 23 and 25 constitute a second inverter. The output of the first inverter and the input of the second inverter are connected to the node FLG, and the input of the first inverter and the output of the second inverter are connected to the node LAT. Hence, the latch circuit 132 holds data at the node LAT, and the data inverse to that data at the node FLG.

1.3 Configuration of the Driver 125

FIG. 4 is a block diagram showing the driver 125. How the voltage at the signal line for the signal BLV, which is connected to the sense amplifier 113, and the voltage at the node NC, are switched will be explained below in detail. First, the sense amplifier 113, to which the node NC and the signal line for the signal BLV are connected, will be described. In the sense amplifier 113, the sense amplifier units 130 are arranged in the form of a matrix. For example, n+1 sense amplifier units 130, which are associated with the bit lines BL0 to BLn connected to the blocks BLK of the same column, are arranged in one column. The sense amplifier units 130 provided in the sense amplifier 113 are connected, in common, to the nodes NC. The signals BLV input to the n+1 sense amplifier units 130 of the same column are independent of one another. Signals BLV0 to BLVn are input to the sense amplifier units 130 associated with the bit lines BL0 to BLn, respectively. A common signal BLV is input to the sense amplifier units 130 arranged in the same row.

The driver 125 will be described. The driver 125 includes switch circuits 140 to 145. The switch circuit 140 can transfer the voltage VDD or the voltage VSS to the switch circuit 143. The switch circuit 141 includes n+1 switch circuits 142_0 to 142_n associated with signals BLV0 to BLVn, respectively. The switch circuits 142_0 to 142_n can transfer either voltage VBLV_DMY or voltage VSRC applied from a VSRC generator, to the switch circuit 143. The switch circuit 143 includes n+1 switch circuits 144_0 to 144_n associated with the signals BLVD to BLVn, respectively. The switch circuits 144_0 to 144_n transfer the voltages applied from the switch circuit 140 or 141 to the signal lines for signals BLV0 to BLVn. The driver 125 can therefore set the voltage of the signals BLV0 to BLVn to voltage VDD, voltage VSS, voltage VBLV_DMY or voltage VSRC.

The switch circuit 145 can transfer voltage VSRC, voltage VDDSA or voltage VSS to the node NC.

1.4 Write Operation

The write operation will be explained. In the write operation performed in this embodiment, the sequencer 121 checks the power-supply voltage VCC from the signal Smoni_A and the signal Smoni_B, both received from the voltage detector 122.

1.4.1 Flow of the Overall Write Operation

FIG. 5 is a flowchart explaining the write operation in detail. At first, the sequencer 121 checks whether the power-supply voltage VCC has fallen or not, in response to the write command receiving from the external controller. More specifically, the sequencer 121 checks, on the basis of the signals Smoni_A and Smoni_B, whether the power-supply voltage VCC is higher than the voltage Vm_B (Step S101).

If the power-supply voltage VCC is higher than the voltage Vm_B (Yes in Step S101), or if the signals Smoni_A and Smoni_B are both at "L" level, the sequencer 121 executes a program. The program is an operation of injecting electrons into the charge accumulation layer, thereby raising the threshold voltage in the write operation.

Next, the sequencer 121 performs a verify operation (Step S103). The verify operation is an operation of checking whether the threshold voltage of the memory cell transistors MT has reached a target value (verify level) as a result of the program. Hereinafter, if the verify operation shows that the threshold voltage has reached the target value, it is referred to as "have passed the verify operation". If the verify operation shows that the threshold voltage has not reached the target value, it is referred to as "have failed the verify operation".

If the sequencer 121 fails the verify operation (No in Step S104), it repeats Steps S102 and S103 until it passes the verify operation (Yes in Step S104) or until it repeats Steps S102 and S103 a preset number of times. When the sequencer 121 passes the verify operation, the write operation is normally completed.

If the power-supply voltage VCC is lower than the voltage Vm_B (No in Step S101), or more precisely if the signals Smoni_A and Smoni_B are at "L" level and "H" level, respectively, the sequencer 121 performs a clamp check operation (Step S105). The clamp check operation is a dummy-verify operation the sense amplifier 113 performs because the voltage VDDSA falls as the power-supply voltage VCC decreases. In the clamp check operation, it is checked whether the voltage at the node SEN changes (falls) in any sense amplifier unit monitored, in the same way as in the verify operation. Hereinafter, if the voltage at the node SEN falls and the transistor 18 is turned off, it is referred to as "have failed the clamp check operation". If the voltage at the node SEN scarcely falls and the transistor 18 is turned on, it is referred to as "have passed the clamp check operation".

If the sequencer 121 passes the clamp check operation (Yes in Step S106), it goes to Step S102.

If the sequencer 121 fails the clamp check operation (No in Step 106), it operates in a program suspend mode, temporarily interrupting the write operation (Step S107).

Next, when the power-supply voltage VCC rises above the voltage Vm_B, the signal Smoni_B falls to "L" level (Step S108). The sequencer 121 is then released from the program suspend mode, and starts the write operation (Step S109). Then, the sequencer 121 goes to Step S102.

1.4.2 Details of the Verify Operation

Figure 6:
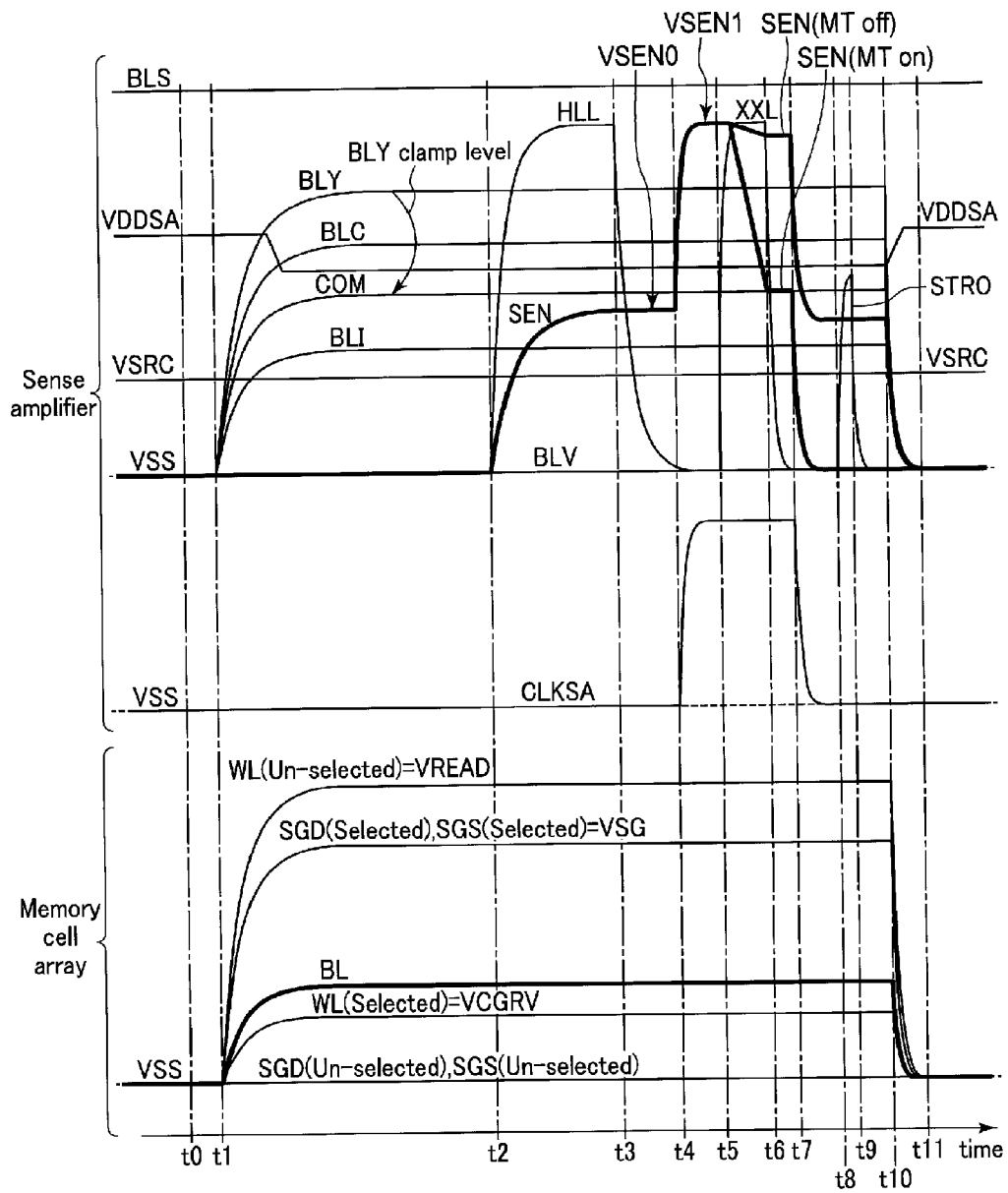
FIG. 6 is a timing chart showing voltages of various lines during a verify operation performed in in the nonvolatile semiconductor memory device according to the first embodiment.

FIG. 6 is a timing chart showing the voltages of the various lines during the verify operation. First, at time t0, the sequencer 121 sets the signal BLS to "H" level, connecting the sense amplifier units 130 to the bit lines BL associated therewith. The threshold voltage of the re-channel MOS transistors provided in each sense amplifier unit 130 is denoted by Vt. Then, the voltage VBLS on the signal BLS, which is at "H" level, has a relation of VBLS>VBL+Vt, with the voltage VBL on the associated bit line BL. The voltage VDDSA is applied to the node NA, and voltage VSRC (>VSS) is applied to the source line SL. The sequencer 121 sets the signal BLV to "L" level (e.g., VSS) in order to turn off the transistor 11 in the verify operation. The sense amplifier unit 130 is thereby electrically disconnected from the node NC.

Then, at time t1, the sequencer 121 applies "L" level to the node FLG of the sense amplifier unit 130 associated with the memory cell transistor MT to be verified. The transistor 19 is thereby turned on applying the voltage VDDSA to the node BLYC. The sequencer 121 then sets the signals BLY and BLC to "H" level, turning on the transistors 12 and 13. A voltage is therefore applied to the node BLYC, the node COM and the node BLI, respectively. The voltage VDDSA, the voltage VBLY, i.e., "H" level of signal BLY, and the voltage VBLC, i.e., "H" level of signal BLC, have the relation of VDDSA>(VBLY-Vt)>(VBLC-Vt). The voltage at the node COM rises to voltage VBLY-Vt clamped by the transistor 13. The voltage at the node BLI rises to voltage VBLC-Vt clamped by the transistor 12. Since the transistor 10 is on, the voltage at the node BLI is transferred to the bit line BL. As a result, voltage VBL is equal to VBLC-Vt. The voltage VBL on the bit line BL is equal to or higher than the voltage VSRC on the source line.

The row decoder 112 applies voltage VSG to the select gate lines SGD and SGS associated with the memory cell transistors MT that should be programmed. The selection transistors ST1 and ST2 are thereby turned on. The row decoder 112 applies voltage VCGRV to the selected word lines, and voltage VREAD to the un-selected word lines. The voltage VCGRV is set in accordance with read data (verify level set in the verify operation). The voltage VREAD is a voltage for turning on the memory cell transistors MT, irrespective of the threshold voltage of the memory cell transistors MT. The voltage VREAD is higher than the voltage VCGRV (VREAD>VCGRV).

Hence, cell current Icell flows from the side of bit lines BL to the side of source line SL, in accordance with the threshold voltage Vtc of the memory cell transistors MT that should be programmed. If the threshold voltage Vtc is higher than the verify level, or if the memory cell transistor MT has been programmed, the memory cell transistor MT is turned off, and the cell current Icell does not flow in the associated sense amplifier unit 130. If the threshold voltage Vtc is lower than the verify level, or if the memory cell transistor MT has not been programmed, the memory cell transistor MT is turned on, and the cell current Icell flows in the associated sense amplifier unit 130. The voltage VDDSA drops in accordance with the value of in the cell current Icell.

Next, the sequencer 121 sets signal HLL to "H" level at time t2. The node SEN is thereby pre-charged with the voltage transferred from the node NB, and the voltage at the node SEN rises to the voltage VSEN0.

At time t3, the sequencer 121 sets the signal HLL to "L" level, electrically floating the node SEN.

At time t4, the sequencer 121 sets signal CLKSA to "H" level. The voltage at the node SEN rises by the voltage VCLKSA of the signal CLKSA, because the node SEN is floating, staying in capacitive coupling with the capacitor element CA. Thus, the voltage at the node SEN changes to voltage VSEN1 that is higher than the voltage VDDSA.

In the period between time t5 and time t6, the sequencer 121 sets the signal XXL to "H" level, turning on the transistor 15. If the cell current Icell flows in the associated bit line BL, the node SEN is electrically discharged (see "SEN(MT on)" shown in FIG. 6) and is set to the same voltage as the voltage at the node COM. If the cell current Icell does not flow in the associated bit line BL, the node SEN is scarcely discharged (see "SEN(MT off)" shown in FIG. 6), and remains at a voltage nearly equal to voltage VSEN1.

At time t6, the sequencer 121 sets signal XXL to "L" level, electrically floating the node SEN.

At time t7, the sequencer 121 sets signal CLKSA to "L" level. The voltage at the node SEN falls by voltage VCLKS, because the node SEN is electrically floating and remains in capacitive coupling with the capacitive element CA.

In the period between time t8 and time t9, the sequencer 121 checks the voltage at the node SEN. More precisely, the signal STRO is set to "H" level, turning on the transistor 17. The voltage at the node SEN therefore falls as the node SEN is electrically discharged. If the voltage at the node SEN has fallen below the threshold voltage Vtsen of the transistor 18, the transistor 18 remains off and cannot discharge the node LBUS already pre-charged. "H" level is therefore latched to, for example, the latch circuit 132. If the node SEN is not electrically discharged, the voltage at the node SEN is higher than the threshold voltage Vtsen. In this case, the transistor 18 is turned on, the node LBUS is electrically discharged, and "L" level is latched in, for example, the latch circuit 132. If "H" level is latched in the latch circuit 132, the sequencer 121 determines that it has failed the verify operation. If "L" level is latched in the latch circuit 132, the sequencer 121 determines that it has passed the verify operation.

Next, in the period between time t10 and time t11, a recovery operation is performed, thereby terminating the verify operation. At this point, the voltage VDDSA that has fallen rises back to the value it had before the verify operation.

The verify operation explained above can be applied to the read operation.

1.4.3 Details of the Clamp Check Operation

It will be first explained how the switch circuits 140 to 145 are set in the driver 125 to perform the clamp check operation.

FIG. 7 is a block diagram showing how the driver 125 operates in the clamp check operation. In the clamp check operation, the sense amplifier units 130 of the same column are divided into two groups. One group is composed of units 130 (hereinafter referred to as "sense amplifier units SAU_read") that perform the clamp check operation. The other group is composed of units 130 (hereinafter referred to as "sense amplifier units SAU_DMY") in which dummy cell current Icell_DMY flows to drop the voltage VDDSA as in the verify operation. In the case of FIG. 7, signals BLV0 to BLVn−1 are input to the sense amplifier units SAU_DMY, and signal BLVn is input to the sense amplifier units SAU_read. At least one sense amplifier unit SAU_read suffices, and the number the units SAU_read used is optional. Further, the sense amplifier units SAU_DMY are used in such numbers that the dummy cell current Icell_DMY may almost equal the cell current Icell.

The driver 125 connects the node NC to the VSRC generator, and applies the voltage VSRC to the node NC. The driver 125 further sets the signals BLV0 to BLVn−1 to input to the sense amplifier units SAU_DMY, to the voltage VBLV_DMY, and sets the signals BLVn to input to the sense amplifier units SAU_read, to voltage VSRC. The voltage VLBY_DMY is a voltage that turns on the transistors 11 of the sense amplifier units SAU_DMY in the clamp check operation.

The voltages applied to the lines and the operation the sense amplifier 113 performs, in the clamp check operation, will be explained below.

Figure 8:
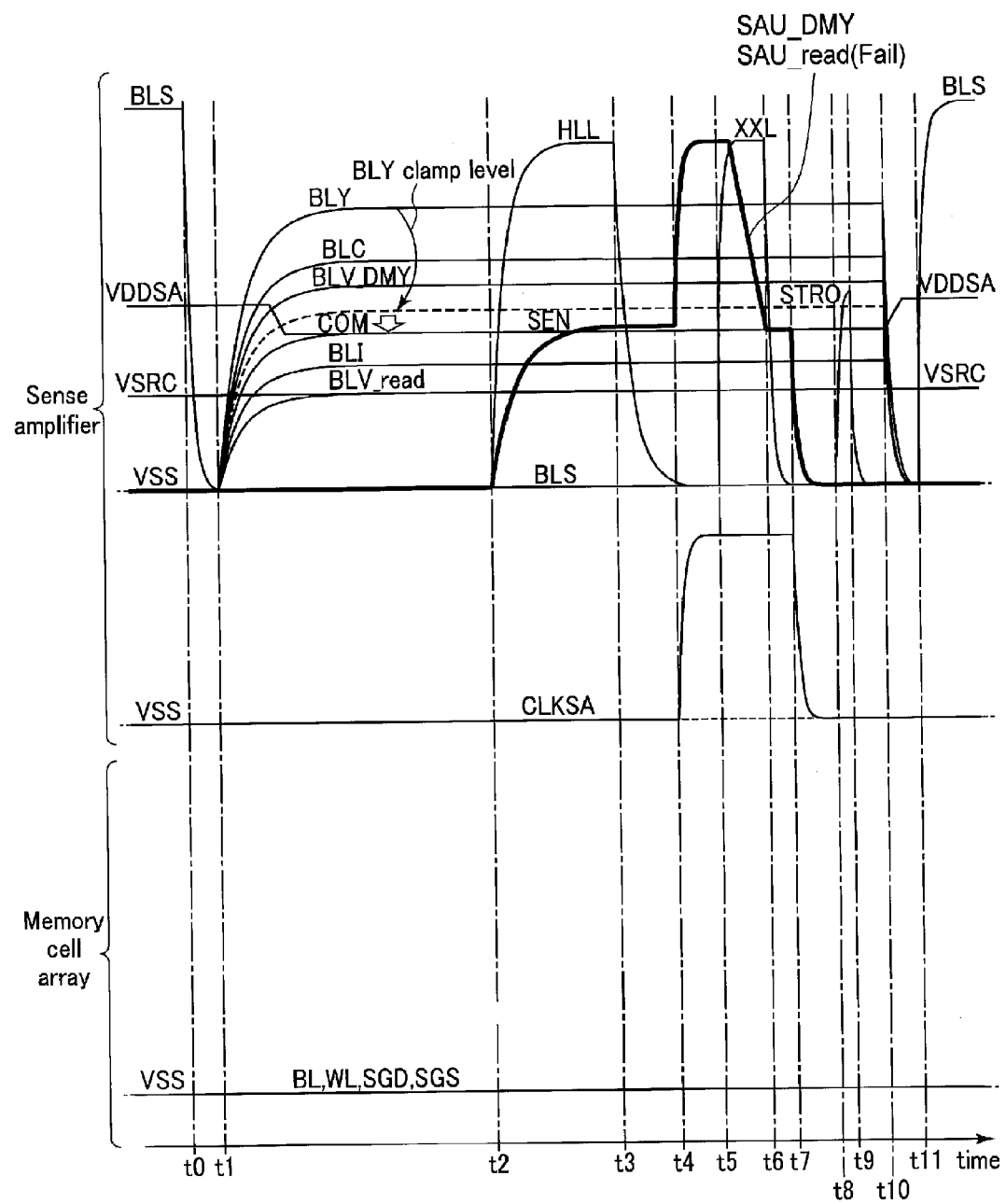
FIG. 8 is a timing chart showing voltages of various lines when the clamp check operation fails in the nonvolatile semiconductor memory device according to the first embodiment.
Figure 9:
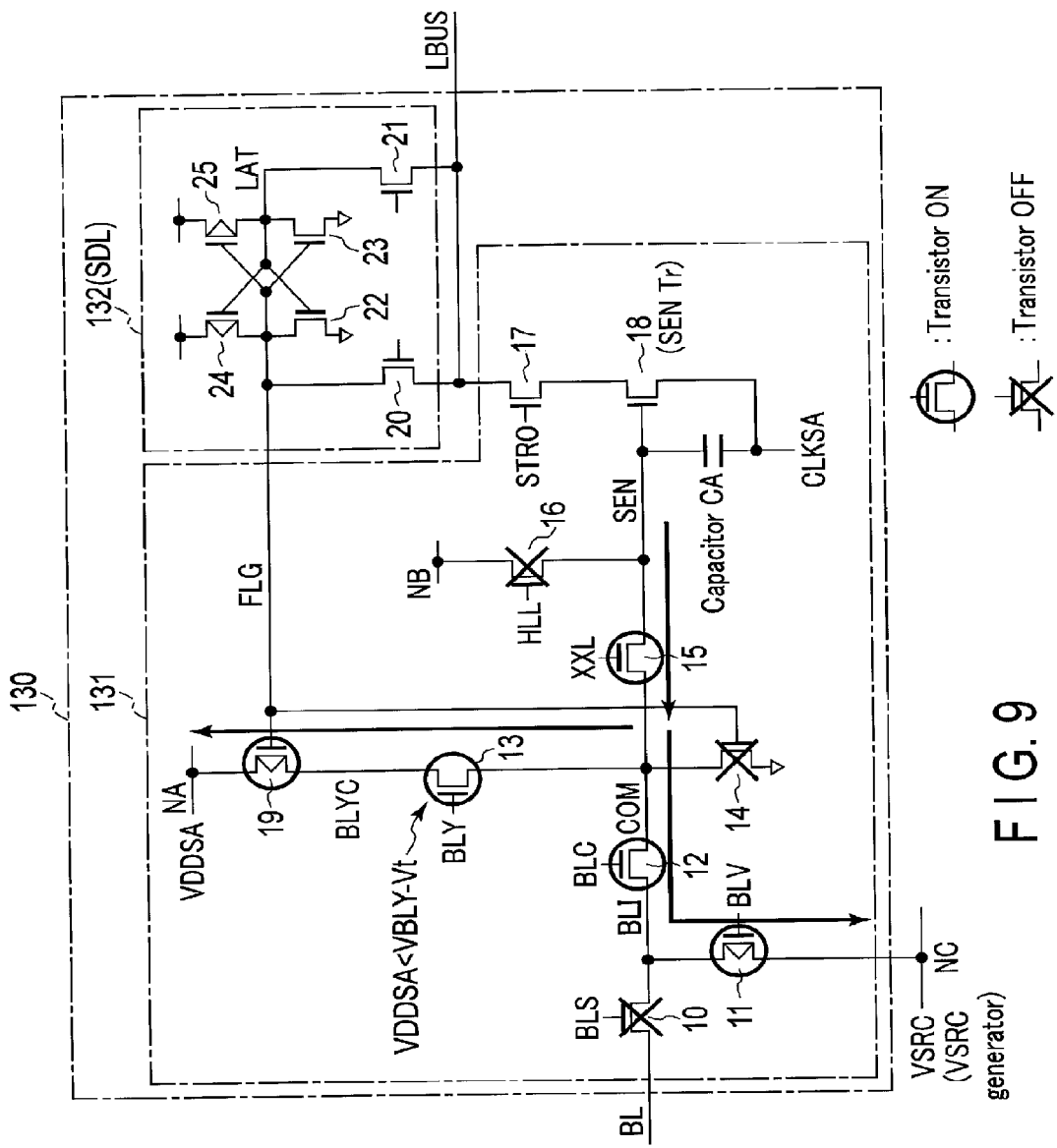
FIG. 9 is a circuit diagram showing how the node SEN is electrically discharged during the clamp check operation in the sense amplifier provided in the nonvolatile semiconductor memory device according to the first embodiment.
Figure 11:
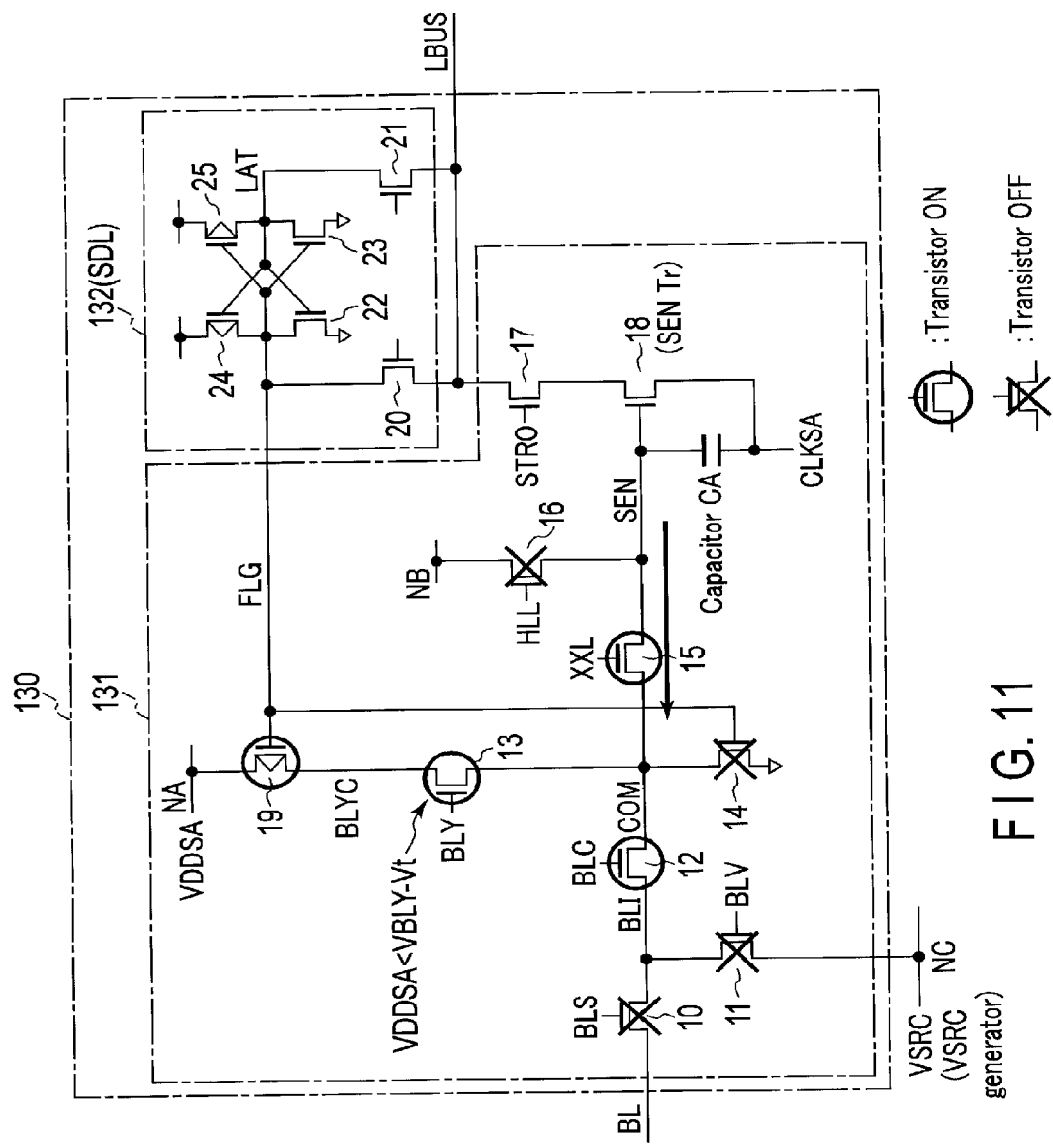
FIG. 11 is a circuit diagram showing how the node SEN is electrically discharged during the clamp check operation in the sense amplifier provided in the nonvolatile semiconductor memory device according to the first embodiment.

FIG. 8 is a timing chart showing the voltages applied to the lines when the clamp check operation fails. FIGS. 9 to 11 are diagrams showing how the node SEN is electrically discharged. In the clamp check operation, the sense amplifier 113 performs an operation similar to the verify operation. Hereinafter, only the points different from the verify operation will be explained. First, at time t0, the node NC of the sense amplifier 130 is connected to the VSRC generator and applied with the voltage VSRC lower than the voltage at the node BLI, as has been explained with reference to FIG. 7. The sequencer 121 sets the signal BLS to "L" level, electrically disconnecting the bit line BL associated with the sense amplifier 130. At the time of the clamp check operation, no voltage is applied to the memory cell transistor MT that should be programmed. This is why the row decoder 112 applies voltage VSS to the select gate lines SGD and SGS of any block BLK, no matter whether the block BLK is selected or not selected, thereby turning off the selection transistors ST1. Further, the row decoder 112 applies VSS to the word line WL.

Next, at time t1, the sequencer 121 applies voltage VSRC to the signal BLV ("signal BLV_read" shown in FIG. 8) input to the sense amplifier unit SAU_read, turning off the transistor 11. Then, the sequencer 121 applies voltage VBLV_DMY to the signal BLV ("signal BVL_DMY" shown in FIG. 8) input to the sense amplifier unit SAU_DMY, turning on the transistor 11. Further, the sequencer 121 electrically connects the sense amplifier unit SAU_DMY to the node NC, and thus to the VSRC generator. The voltage VBLV_DMY, which turns on the transistor 11, has a relation of VBLY-DMY> (VSRC+Vt). For example, the voltage VBLV-DMY is set to such a value that the dummy cell current Icell_DMY may almost equal the cell current Icell that flows during the verify operation.

When the dummy cell current Icell_DMY flows, the voltage VDDSA drops in accordance with the value of the current. At this point, the voltage VDDSA falls below the voltage VBLY-Vt. Hence, the transistor 13 does not clamp the voltage VDDSA, and the voltage VDDSA changes to the voltage at the node COM (thus, VDDSA=voltage at the node COM). A current therefore flows in the transistor 13, too, from the node COM to the node NA. In this state, the sequencer 121 keeps the transistor 15 on in the period between time t5 and time t6. In the sense amplifier unit SAU_DMY, currents flow in the nodes NC and NA, electrically discharging the node SEN (see FIG. 9). In the sense amplifier unit SAU_read, a current flows from the node SEN to the node NA, and the node SEN is electrically discharged as in the sense amplifier unit SAU_DMY (see FIG. 10).

On the other hand, the voltage VDDSA is clamped at the transistor 13, thus VDDSA≥(VBLY-Vt). In this case, a current flows through the node NC, and the node SEN is electrically discharged, in the sense amplifier unit SAU_DMY. In the sense amplifier unit SAU_read, a current does not flow from the node SEN to the node NA, and the voltage at the node SEN scarcely falls (see FIG. 11).

In the period between time t8 and time t9, the sequencer 121 checks the voltage at the node SEN in the sense amplifier SAU_read. If a current flows through the node NA and the voltage at the node SEN therefore falls, the latch circuit 132 latches "L" level. In this case, the sequencer 121 fails the clamp check operation. If a current scarcely flows through the node NA and the voltage at the node SEN scarcely falls, the latch circuit 132 latches "H" level. In this case, the sequencer 121 passes the clamp check operation.

1.5 Advantage of the First Embodiment

So configured as described above, this embodiment can enhance the reliability of the write operation, as will be explained below.

In the read operation and verify operation, the cell current Icell flows at the time of sensing the voltage. The voltage VDDSA may therefore fall in some cases. If the power-supply voltage VCC falls below the lower limit of the operating voltage range, the voltage VDDSA will fall more prominently. If the voltage VDDSA falls below the voltage VBLV_Vt, it cannot be clamped by the transistor 13, and will be equal to the voltage at the node COM. At the time of sensing the voltage, the node SEN is first charged to a voltage higher than the voltage VDDSA and is then discharged. The voltage at the node SEN is therefore discharged to the node NA unless the transistor 13 clamps the voltage VDDSA. Hence, the node SEN is electrically discharged, irrespective of the threshold voltage Vtc of the memory cell transistor MT. This results in a sensing error. If the sensing error occurs in, for example, the verify operation, any memory cell transistor MT whose threshold voltage Vtc has reached the target level will be erroneously determined to have failed the verify operation. In this case, the memory cell transistor MT is excessively programmed, and its threshold voltage Vtc inevitably keeps increasing. For example, in the write operation and read operation, the threshold voltage of the un-selected memory cell transistor MT may be excessively high. In this case, the memory cell transistor MT is not turned on as voltage is applied to the un-selected word line. Consequently, erroneous data writing or reading may take place. Further, erroneous data writing occurs if the threshold voltage Vtc excessively rises above the target write level in the case where the memory cell transistor MT can hold data greater than two bits.

The voltage detector 122 monitors the power-supply voltage VCC. When the power-supply voltage VCC falls below the monitoring level (voltage Vm_A), the nonvolatile semiconductor memory device stops operating. However, in order to ensure the nonvolatile semiconductor memory device does not needlessly operate, the monitoring level at this point is set lower than the level at which erroneous sensing may occur, in consideration of, for example, a momentary drop in the power-supply voltage VCC. In order to prevent the power-supply voltage VCC from causing erroneous sensing when the power-supply voltage VCC falls below the lower limit of the operating voltage range, a voltage compensating circuit may be used. However, it is difficult to use such a voltage compensating circuit, owing to demands for low power consumption and lower costs in recent years.

In the nonvolatile semiconductor memory device according to this embodiment, a new monitoring level (voltage Vm_B) is added in the voltage detector 122. If a write command is received from the external controller while the power-supply voltage VCC remains higher than the voltage Vm_A and equal to or lower than the voltage Vm_B, the clamp check operation can be performed to check whether erroneous sensing may occur or not. If the sequencer passes the clamp check operation, it can be determined that the possibility of error sensing is low, and the write operation is therefore performed. If the sequencer fails the clamp check operation, it can be determined that the possibility of error sensing is high. In this case, the write operation is interrupted until the power-supply voltage VCC rises above the voltage Vm_B. Erroneous verification can therefore be prevented in the verify operation, and the memory cell transistor is prevented from being programmed excessively. This can enhance the reliability of the write operation.

Further, in the nonvolatile semiconductor memory device according to this embodiment, the clamp check operation can prevent erroneous writing. Such a voltage compensating circuit as mentioned above need not be used if the power-supply voltage VCC is lower than the lower limit of the operating voltage range. An increase in the chip area can therefore be prevented.

Moreover, in the nonvolatile semiconductor memory device according to this embodiment, the sense amplifier 113 can be used to perform the clamp check operation. Therefore, no sense circuits for the clamp check operation need be provided. Since the clamp check operation can be performed without using memory cell transistors MT, data need not be written to perform the clamp check operation, and no memory cell transistors MT for the clamp check operation need be provided. Hence, an increase in the number of circuits or memory cell transistors MT required for the clamp check operation can be suppressed. An increase in the chip area can be therefore suppressed.

2. Second Embodiment

A nonvolatile semiconductor memory device according to a second embodiment will be described. The second embodiment differs from the first embodiment in that the sense amplifier 113 is connected to the VSRC generator via the bit lines BL and source line SL, not via the NAND strings 116. Only the features that distinguish the second embodiment from the first embodiment will be described below.

2.1 Configuration of the Memory Cell Array 111

FIG. 12 is a block diagram showing the memory cell array 111 according to the second embodiment. An n-channel MOS transistor 30 is provided in the memory cell array 111. A signal BLSRC is input to the gate of the MOS transistor 30. Bit lines BL0 to BLn are connected, in common, to one of the source and drain of the MOS transistor 30, and the source line SL is connected to the other of the source and drain of the MOS transistor 30. To read, write or erase data, for example, the transistor 30 electrically disconnects the bit lines BL from the source line SL when it is turned off as the signal BLSRC is set to "L" level. Alternatively, one of the source and drain of the MOS transistor 30 may be connected to the VSRC generator, not via the source line SL.

2.2 Configuration of the Driver 125

Figure 13:
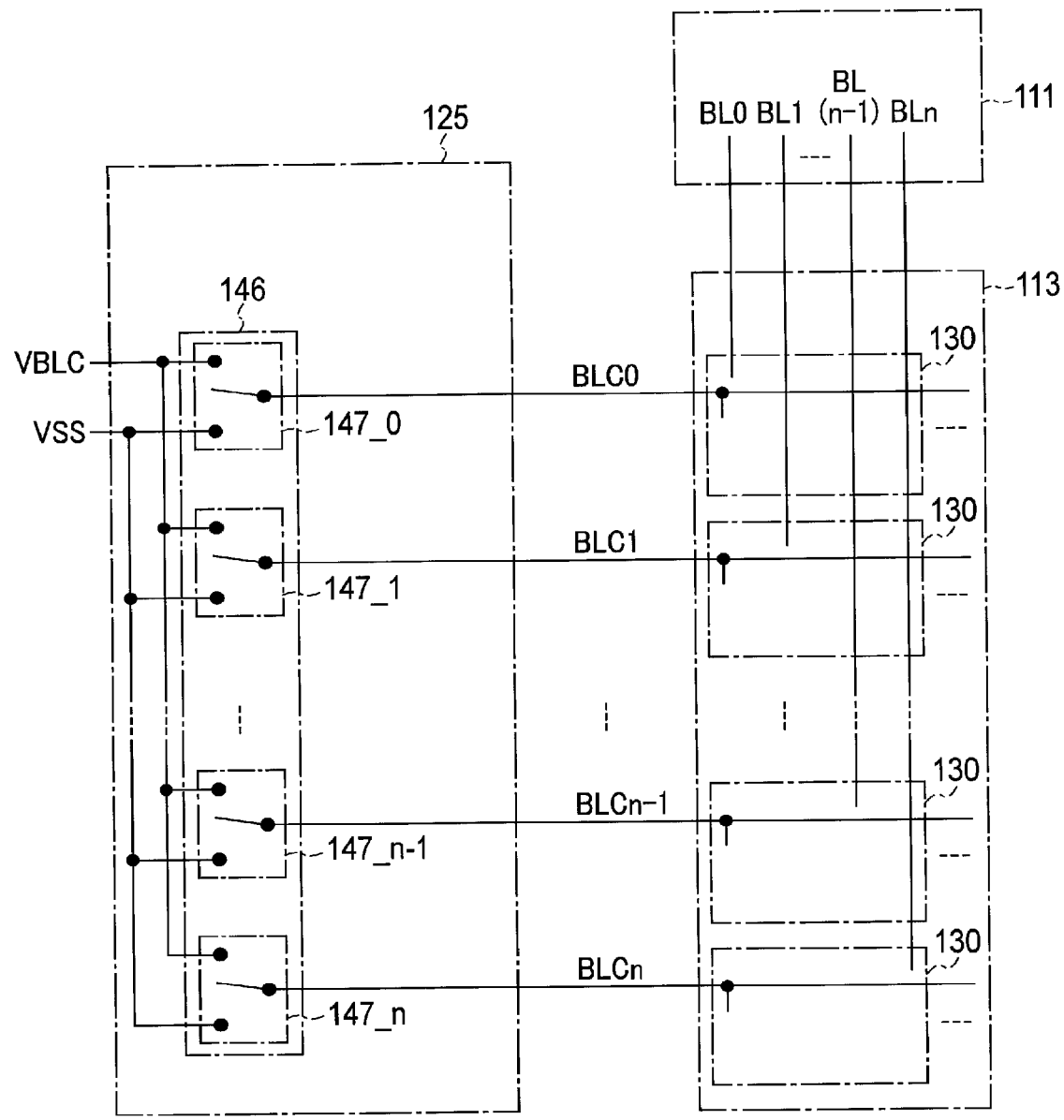
FIG. 13 is a block diagram showing a driver provided in the nonvolatile semiconductor memory device according to the second embodiment.

FIG. 13 is a block diagram showing the driver 125. How the voltage is switched on the signal line connected the sense amplifier 113 to supply the signal BLC will be explained below in detail. First, the connection of the BLC signal line and the sense amplifier 113 will be described. The signals BLC input to the n+1 sense amplifier units 130 arranged in one column are independent of one another. That is, signals BLC0 to BLCn are input to the sense amplifiers 130 associated with the bit lines BL0 to BLn, respectively. The sense amplifiers 130 arranged in the same row receive a common signal BLC.

The driver 125 includes a switch circuit 146 that has n+1 switch circuits 147_0 to 147_n associated with the signals the signals BLC0 to BLCn, respectively. The switch circuits 147_0 to 147_n can transfer either the voltage VBLC the signal BLC has at "H" level or the voltage VSS the signal BLC has at "L" level.

In the driver 125 used in this embodiment, the signal line for transferring the signal BLV (not shown) may be connected, in common, to the sense amplifier units 130 provided in the sense amplifier 113. That is, the signal BLV may be common to all sense amplifiers 130.

2.3 Write Operation

The overall flow of the write operation performed in this embodiment and the voltage applied in the verify operation in this embodiment are identical to those in the first embodiment. Only the features that distinguish the clamp check operation from that of the clamp check operation performed in the first embodiment will be described below.

2.3.1 Details of the Clamp Check Operation

First, it will be explained how to set the switch circuits 147 provided in the driver 125 in the clamp check operation.

Figure 14:
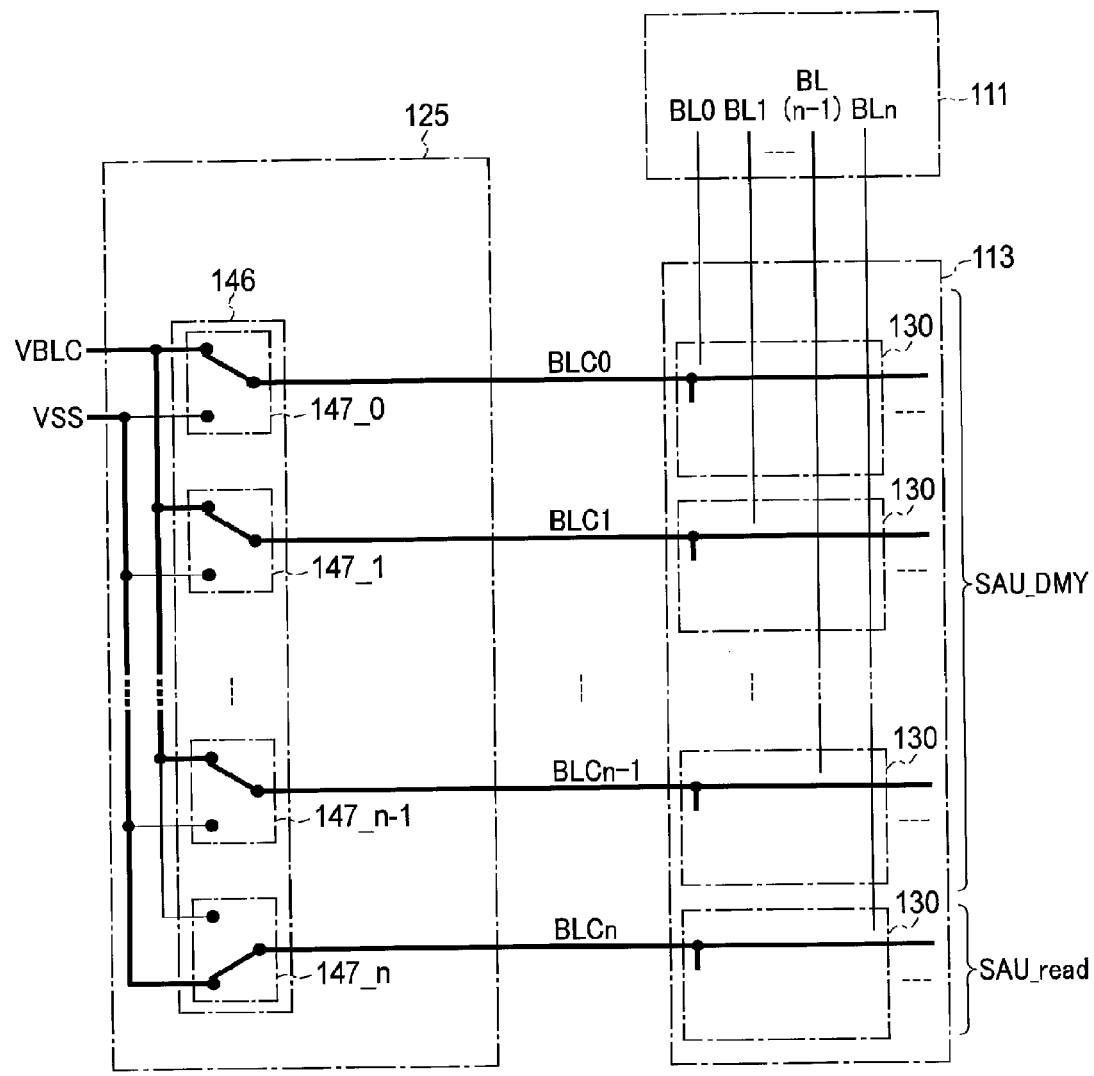
FIG. 14 is a block diagram showing how the driver operates in the clamp check operation in the nonvolatile semiconductor memory device according to the second embodiment.

FIG. 14 is a block diagram showing the driver 125 operating in the clamp check operation. The driver 125 sets the signals BLC0 to BLCn−1 input to the sense amplifier unit SAU_DMY, to voltage VBLC, and the signal BLCn input to the sense amplifier unit SAU_read, to voltage VSS.

The voltage each line has in the clamp check operation and the operation the sense amplifier 113 performs in the clamp check operation will be explained below.

FIG. 15 is a timing chart showing the voltages that the lines have when the clamp check operation fails. First, at time t0, the sequencer 121 sets the signal BLS to "H" level, turning on the transistor 10.

Next, at time t1, the sequencer 121 maintains the signal BLV at VSS, keeping the transistor 11 in the off state. The sense amplifier 113 is therefore electrically disconnected from the node NC. The sequencer 121 applies voltage VSS to the signal BLC ("signal BLC_read" shown in FIG. 15) input to the sense amplifier SAU_read, whereby the transistor 12 is turned off. The sense amplifier unit SAU_read is thereby electrically disconnected from the bit line BL associated with it. On the other hand, the sequencer 121 applies voltage VBLC to signal BLC ("signal BVC_DMY" shown in FIG. 15) input to the sense amplifier unit SAU_DMY, turning on the transistor 12. The sense amplifier unit SAU_DMY is thereby electrically connected to the associated bit lines BL.

The sequencer 121 applies voltage VBLSRC_DMY to the signal BLSRC, turning on the transistor 30 and connecting the bit lines BL to the source line SL. For example, the voltage VBLSRC_DMY is set to such a value that the dummy cell current Icell_DMY flowing in the bit lines BL at a voltage higher than voltage VSRC+Vt may become similar to the cell current Icell flowing in the verify operation. Then, the sense amplifier unit SAU_DMY is connected to the VSRC generator via the bit lines, transistor 30 and source line SL which are associated with it. As a result, the dummy cell current Icell_DMY flows from the sense amplifier unit SAU_DMY to the VSRC generator. The row decoder 112 sets the select gates lines SGD and SGS of all blocks BLK to "L" level, turning off the selection transistors ST1 and ST2 provided in any block BLK. Hence, no current flows from the bit lines BL or the source line SL to the NAND strings 116.

2.4 Advantage of the Second Embodiment

Configured as described above, this embodiment achieves the same advantage as the first embodiment.

3. Modifications

The nonvolatile semiconductor memory devices according to the embodiments includes a first memory cell transistor (MT0 shown in FIG. 1), a first bit line (BL0 in FIG. 1), a source line (SL in FIG. 1), a first sense amplifier unit (130 shown in FIG. 4), a voltage generator (VSRC generator in FIG. 1), and a switch circuit (145 in FIG. 4). The first bit line is coupled to the first memory cell transistor. The source line is coupled to the first memory cell transistor. The first sense amplifier unit is coupled to the first bit line. The voltage generator is capable of applying a voltage (VSRC in FIG. 4) to the source line. The switch circuit is electrically connectable the first sense amplifier unit to the voltage generator, without using the first bit line. In a case where a power-supply voltage is equal to or lower than the first voltage (Vm_B in FIG. 2) and is higher than the second voltage (Vm_A in FIG. 2) when an access operation to the first memory cell transistor is started, the first sense amplifier unit is electrically disconnected from the first bit line (Tr 10 being off, in FIG. 9) and is electrically connected to the voltage generator via the switch circuit (145 in FIG. 7).

The embodiments described above can provide a semiconductor memory device having high reliability. The embodiments are not limited to the configurations described above. Various modifications are possible.

In the embodiments described above, the clamp check operation may be performed every time the program and verify operation are repeated. Such a modification is shown in FIG. 16.

FIG. 16 is a flowchart explaining the write operation in detail. If the sequencer 121 fails the verify operation (No in Step S104), it performs the program again. In this case, too, the sequencer 121 checks whether the power-supply voltage VCC has fallen or not (Step S101).

In the embodiments described above, the clamp check operation is performed at the start of the write operation. The clamp check operation may also be performed at the start of accessing the memory cell array 111 (to write, read or erase data). Then, erroneous data reading is controlled while the memory cell is being accessed. This can enhance the reliability of the cell accessing operation.

Further, in the embodiments described above, the signal Smoni_A may be set to, for example, "H" level as long as the power-supply voltage VCC is lower than the voltage Vm_A, and the signal Smoni_B may remain at, for example, "H" level as long as the power-supply voltage VCC is lower than the voltage Vm_B.

Still further, sense amplifier units of the voltage-sensing type may be used in the embodiments described above.

The embodiments described above can be applied to any 3D stacked NAND flash memory having memory cell transistors stacked above the semiconductor substrate. The embodiments can be applied also to various semiconductor memory devices, whether volatile or nonvolatile, which perform a program and verify operation.

Regarding the embodiments described above, the words "connect" and "couple" mean that components are directly connected to one another, and also that they are connected via other components, such as transistors or resistors.

Each embodiment may be modified as follows. That is, each memory cell transistor MT can hold 2-bit (4-level) data. The four threshold levels holding 4 data levels, respectively, any one of which each transistor MT may hold, are "E" level (erase level), "A" level, "B" level and "C" level in ascending order.

(1) Read Operation

The voltage applied to any word line selected to read data at "A" level ranges, for example, from 0V to 0.55 V. The voltage range is not limited to this. The range may instead be 0.1 V to 0.24 V, 0.21 V to 0.31 V, 0.31 V to 0.4 V, 0.4 V to 0.5 V or 0.5 V to 0.55 V.

The voltage applied to any word line selected to read "B" level data ranges, for example, from 1.5V to 2.3 V. The range is not limited, nonetheless. The voltage may be 1.65 V to 1.8 V, 1.8 V to 1.95 V, 1.95 V to 2.1 V, or 2.1 V to 2.3 V.

The voltage applied to any word line selected to read "C" level data ranges, for example, from 3.0 V to 4.0 V. The range is not limited, nonetheless. The voltage may be 3.0 V to 3.2 V, 3.2 V to 3.4 V, 3.4 V to 3.5 V, 3.5 V to 3.6 V, or 3.6 V to 4.0 V.

The read operation time (tR) may be, for example, 25 µs to 38 µs, 38 µs to 70 µs, or 70 µs to 80 µs.

(2) Write Operation

As stated above, the write operation includes the program and the verify operation. In the write operation, the voltage first applied to any selected word line in the program operation ranges, for example, from 13.7 V to 14.3 V. The range is not limited, nonetheless. The voltage may be, for example, 13.7 V to 14.0 V or 14.0 V to 14.6 V.

The voltage applied first to any odd-numbered word line selected to write data may be different from the voltage applied first to the even-numbered word line selected to write data.

The program may be ISSP (Incremental Step Pulse Program). In this case, the step-up voltage may be, for example, about 0.5 V.

The voltage applied to any un-selected word line may be, for example, 6.0 V to 7.3 V. The range is not limited to this. For example, the range may be 7.3 V to 8.4 V. Further, the voltage may be 6.0 V or less.

The pass voltage to apply may be changed in accordance with whether the un-selected word line is an odd-numbered word line or an even-numbered word line.

The write operation time (tProg) may be, for example, 1700 μs to 1800 μs, 1800 μs to 1900 μs, or 1900 μs to 2000 μs.

(3) Erase Operation

The voltage first applied to the well, which is made in the upper part of the semiconductor substrate and above which the memory cell is arranged, ranges, for example, from 12 V to 13.6 V. The range is not limited, nonetheless. The voltage may be, for example, 13.6 V to 14.8 V, 14.8 V to 19.0 V, 19.0 V to 19.8 V, or 19.8 V to 21 V.

The erase operation time (tErase) may be, for example, 3000 μs to 4000 μs, 4000 μs to 5000 μs or 4000 μs to 9000 μs.

(4) Structure of the Memory Cell

Each memory cell includes a charge accumulation layer arranged on a tunnel insulation layer having thickness of 4 to 10 nm, which is provided on the semiconductor substrate (silicon substrate). The charge accumulation layer may be a stacked structure composed of an insulation film of SiN or SiON, having a thickness of 2 to 3 nm, and a polycrystalline silicon film having a thickness of 3 to 8 nm. A metal such as Ru may be added to the polycrystalline silicon. On the charge accumulation layer, an insulation layer is provided. This insulation layer is composed of, for example, a lower High-k film having a thickness of 3 to 10 nm, an upper High-k film having a thickness of 3 to 10 nm, and a silicon oxide film interposed between the lower and upper High-k films and having a thickness of 4 to 10 nm. The High-k films may be made of HfO, for example. The silicon oxide film can be thicker than the High-k films. Above the insulation layer, a control electrode 30 nm to 70 nm thick is formed. Between the insulation layer and the control electrode, a film is interposed, which has a thickness of 3 to 10 nm and is made of a material for adjusting the work function. The material for adjusting the work function may be a metal oxide such as TaO or metal nitride film such as TaN. The control electrode can be made of, for example, W.

Moreover, an air gap may be provided between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a first memory cell transistor;
   a first bit line coupled to the first memory cell transistor;
   a source line coupled to the first memory cell transistor;
   a first sense amplifier unit coupled to the first bit line;
   a voltage generator capable of applying a voltage to the sense amplifier unit; and
   a switch circuit electrically connectable to the first sense amplifier unit and the voltage generator, without using the first bit line,
   wherein in a case where a power-supply voltage is equal to or lower than a first voltage and is higher than a second voltage when an access operation to the first memory cell transistor is started, the first sense amplifier unit is electrically disconnected from the first bit line and is electrically connected to the voltage generator via the switch circuit.

2. The device according to claim 1, wherein the first sense amplifier unit includes a first interconnect electrically connectable to the first bit line,
   in a case where the power-supply voltage is equal to or lower than the first voltage and higher than the second voltage when a write operation is started, the first sense amplifier unit senses a voltage on the first interconnect, and
   in a case where the power-supply voltage is higher than the first voltage, the first sense amplifier unit is electrically connected to the first bit line without sensing the voltage on the first interconnect, and the write operation is performed while the first sense amplifier unit is electrically disconnected from the voltage generator.

3. The device according to claim 1, further comprising:
   a first selection transistor connectable to the first memory cell transistor to the first bit line; and
   a second selection transistor connectable to the first memory cell transistor to the source line,
   wherein in a case where the power-supply voltage is equal to or lower than the first voltage and higher than the second voltage when a write operation is started, the first and second selection transistors electrically disconnect the first memory cell transistor from the first bit line and the source line.

4. The device according to claim 2, further comprising:
   a second memory cell transistor; and
   a NAND string including the first memory cell transistor and the second memory cell transistor,
   wherein the first and second memory cell transistors are turned off when the voltage on the first interconnect is sensed.

5. The device according to claim 1, wherein the first voltage is lower than a lower limit of an operating voltage range, and the second voltage is lower than the first voltage.

6. The device according to claim 1, further comprising:
   a second memory cell transistor;
   a second bit line coupled to the second memory cell transistor; and
   a second sense amplifier unit coupled to the second bit line,
   wherein the switch circuit is electrically connectable to the second sense amplifier unit and the voltage generator, without using the second bit line, and
   in a case where the power-supply voltage is equal to or lower than the first voltage and is higher than the second voltage when an operation of writing data to the first and second memory cell transistors is started, the second sense amplifier unit is electrically disconnected from the second bit line and the voltage generator.

7. The device according to claim 6, wherein the second sense amplifier unit includes a first interconnect electrically connectable to the second bit line,
   in a case where the power-supply voltage is equal to or lower than the first voltage and higher than the second voltage when the write operation is started, the second amplifier unit checks a voltage on the first interconnect,
   in a case where the voltage on the first interconnect is higher than a third voltage, the write operation is performed in a state that the first sense amplifier unit is electrically connected to the first bit line, the second sense amplifier unit is electrically connected to the second bit line, and the switch circuit electrically disconnects the first and second sense amplifier units from the voltage generator, and in a case where the voltage on the first interconnect is equal to or lower than the third voltage, the write operation is interrupted.

8. The device according to claim 7, wherein in a case where the power-supply voltage rises above the first voltage while the write operation remains interrupted, the write operation is started again in a state that the first sense amplifier unit and the first bit line are electrically connected, the second sense amplifier unit and the second bit line are electrically connected, and the switch circuit electrically disconnects the first and second sense amplifier units from the voltage generator.

9. The device according to claim 7, wherein the second sense amplifier unit includes a first transistor, and the first interconnect is coupled to a gate of the first transistor, and the third voltage accords with a threshold voltage of the first transistor.

10. A nonvolatile semiconductor memory device comprising:
a first memory cell transistor;
a first bit line coupled to the first memory cell transistor;
a source line coupled to the first memory cell transistor;
a first sense amplifier unit coupled to the first bit line;
a voltage generator capable of applying a voltage to the source line; and
a first transistor connectable to the first bit line and the source line, without using the first memory cell transistor,
wherein in a case where a power-supply voltage is equal to or lower than a first voltage and is higher than a second voltage when an access operation to the first memory cell transistor is started, the first sense amplifier unit is electrically connected to the first bit line, the first bit line is electrically disconnected from the first memory cell transistor, and the first bit line is electrically connected to the source line via the first transistor.

11. The device according to claim 10, wherein the first sense amplifier unit includes a first interconnect electrically connectable to the first bit line, in a case where the power-supply voltage is equal to or lower than the first voltage and is higher than the second voltage when a write operation is started, the first sense amplifier unit senses a voltage on the first interconnect, and in a case where the power-supply voltage is higher than the first voltage, the write operation is performed without sensing the voltage on the first interconnect in a state that the first transistor electrically disconnects the first bit line from the source line.

12. The device according to claim 10, further comprising:
a first selection transistor connectable to the first memory cell transistor to the first bit line; and
a second selection transistor connectable to the first memory cell transistor to the source line, wherein in a case where the power-supply voltage is equal to or lower than the first voltage and higher than the second voltage when a write operation is started, the first and second selection transistors electrically disconnect the first memory cell transistor from the first bit line and the source line.

13. The device according to claim 11, further comprising:
a second memory cell transistor; and
a NAND string including the first memory cell transistor and the second memory cell transistor,
wherein the first and second memory cell transistors are turned off when the voltage on the first interconnect is sensed.

14. The device according to claim 10, wherein the first voltage is lower than a lower limit of an operating voltage range, and the second voltage is lower than the first voltage.

15. The device according to claim 10, further comprising:
a second memory cell transistor;
a second bit line coupled to the second memory cell transistor; and
a second sense amplifier unit coupled to the second bit line,
wherein the first transistor is connectable to the second bit line and the source line without using the second memory cell transistor, in a case where the power-supply voltage is equal to or lower than the first voltage and is higher than the second voltage when an operation of writing data to the first and second memory cell transistors is started, the second sense amplifier unit is electrically disconnected from the second bit line.

16. The device according to claim 15, wherein the second sense amplifier unit includes a first interconnect electrically connectable to the second bit line, in a case where the power-supply voltage is equal to or lower than the first voltage and higher than the second voltage when the write operation is started, the second amplifier unit checks a voltage on the first interconnect, in a case where the voltage on the first interconnect is higher than a third voltage, the write operation is performed in a state that the first transistor electrically disconnects the first and second bit lines from the source line, and in a case where the voltage on the first interconnect is equal to or lower than the third voltage, the write operation is interrupted.

17. The device according to claim 16, wherein in a case where the power-supply voltage rises above the first voltage while the write operation remains interrupted, the write operation is started again in a state that the first transistor electrically disconnects the first and second bit lines from the source line.

18. The device according to claim 16, wherein the second sense amplifier unit includes a second transistor, and the first interconnect is coupled to a gate of the second transistor, and the third voltage accords with a threshold voltage of the second transistor.

* * * * *